United States Patent
Leal

(10) Patent No.: US 9,147,583 B2
(45) Date of Patent: Sep. 29, 2015

(54) SELECTIVE DIE ELECTRICAL INSULATION BY ADDITIVE PROCESS

(75) Inventor: Jeffrey S. Leal, Scotts Valley, CA (US)

(73) Assignee: Invensas Corporation, San Jose, CA (US)

( * ) Notice: Subject to any disclaimer, the term of this patent is extended or adjusted under 35 U.S.C. 154(b) by 1043 days.

(21) Appl. No.: 12/913,529

(22) Filed: Oct. 27, 2010

(65) Prior Publication Data

US 2011/0266684 A1   Nov. 3, 2011

Related U.S. Application Data

(60) Provisional application No. 61/255,429, filed on Oct. 27, 2009.

(51) Int. Cl.
```
H01L 21/31      (2006.01)
H01L 21/469     (2006.01)
H01L 21/56      (2006.01)
H01L 21/02      (2006.01)
```
(Continued)

(52) U.S. Cl.
CPC .......... *H01L 21/56* (2013.01); *H01L 21/02282* (2013.01); *H01L 21/02288* (2013.01); *H01L 24/24* (2013.01); *H01L 24/25* (2013.01); *H01L 24/82* (2013.01); *H01L 25/0657* (2013.01); H01L 2224/24145 (2013.01); H01L 2224/76155 (2013.01); H01L 2224/82102 (2013.01); H01L 2225/06551 (2013.01); H01L 2225/06562 (2013.01); H01L 2924/01005 (2013.01); H01L 2924/01006 (2013.01); H01L 2924/01013 (2013.01); H01L 2924/01033 (2013.01); H01L 2924/01047 (2013.01); H01L 2924/01056 (2013.01); H01L 2924/01074 (2013.01); H01L 2924/01082 (2013.01); H01L 2924/14 (2013.01)

(58) Field of Classification Search
CPC ................... H01L 21/02288; H01L 21/02282; H01L 24/82
See application file for complete search history.

(56) References Cited

U.S. PATENT DOCUMENTS

| | | | |
|---|---|---|---|
| 4,323,914 | A | 4/1982 | Berndlmaier et al. |
| 4,336,551 | A | 6/1982 | Fujita et al. |
| 4,363,076 | A | 12/1982 | McIver |

(Continued)

FOREIGN PATENT DOCUMENTS

| | | |
|---|---|---|
| CN | 2512114 Y | 9/2002 |
| CN | 1531069 A | 9/2004 |

(Continued)

OTHER PUBLICATIONS

Notice of Appeal filed Sep. 16, 2010 in response to Mar. 18, 2010 Office Action, U.S. Appl. No. 11/744,142.

(Continued)

*Primary Examiner* — Ha Tran T Nguyen
*Assistant Examiner* — Aaron Dehne
(74) *Attorney, Agent, or Firm* — Lerner, David, Littenberg, Krumholz & Mentlik, LLP

(57) ABSTRACT

Additive processes are employed for electrically insulating selected surface regions on a stack of die; and methods for electrically interconnecting die in a stack of die, include additive processes for electrically insulating selected surface regions of the die. Regions that are not insulated according to the invention are available for electrical connection using electrically conductive material applied in flowable form to make electrically conductive traces.

20 Claims, 28 Drawing Sheets

(51) Int. Cl.
  *H01L 23/00*  (2006.01)
  *H01L 25/065*  (2006.01)

(56) References Cited

U.S. PATENT DOCUMENTS

| | | |
|---|---|---|
| 4,500,905 A | 2/1985 | Shibata |
| 4,784,972 A | 11/1988 | Hatada |
| 5,107,325 A | 4/1992 | Nakayoshi |
| 5,138,438 A | 8/1992 | Masayuki et al. |
| 5,200,362 A | 4/1993 | Lin et al. |
| 5,218,234 A | 6/1993 | Thompson et al. |
| 5,311,401 A | 5/1994 | Gates, Jr. et al. |
| 5,331,591 A | 7/1994 | Clifton |
| 5,334,872 A | 8/1994 | Ueda et al. |
| 5,434,745 A | 7/1995 | Shokrgozar et al. |
| 5,466,634 A | 11/1995 | Beilstein, Jr. et al. |
| 5,538,758 A | 7/1996 | Beach et al. |
| 5,571,754 A | 11/1996 | Bertin et al. |
| 5,616,953 A | 4/1997 | King et al. |
| 5,629,566 A | 5/1997 | Doi et al. |
| 5,675,180 A | 10/1997 | Pedersen et al. |
| 5,691,248 A | 11/1997 | Cronin et al. |
| 5,698,895 A | 12/1997 | Pedersen et al. |
| 5,716,759 A | 2/1998 | Badehi |
| 5,721,151 A | 2/1998 | Padmanabhan et al. |
| 5,731,631 A | 3/1998 | Yama et al. |
| 5,737,191 A | 4/1998 | Horiuchi et al. |
| 5,870,351 A | 2/1999 | Ladabaum et al. |
| 5,879,965 A | 3/1999 | Jiang et al. |
| 5,891,761 A | 4/1999 | Vindasius et al. |
| 5,910,687 A | 6/1999 | Chen et al. |
| 5,946,545 A | 8/1999 | Bertin et al. |
| 5,965,947 A | 10/1999 | Nam et al. |
| 6,030,854 A | 2/2000 | Mashimoto et al. |
| 6,034,438 A | 3/2000 | Petersen |
| 6,087,716 A | 7/2000 | Ikeda |
| 6,107,164 A | 8/2000 | Ohuchi |
| 6,175,158 B1 | 1/2001 | Degani et al. |
| 6,228,686 B1 | 5/2001 | Smith et al. |
| 6,255,726 B1 | 7/2001 | Vindasius et al. |
| 6,262,476 B1 | 7/2001 | Vidal |
| 6,271,598 B1 | 8/2001 | Vindasius et al. |
| 6,297,657 B1 | 10/2001 | Thiessen et al. |
| 6,303,977 B1 | 10/2001 | Schroen et al. |
| 6,315,856 B1 | 11/2001 | Asagiri et al. |
| 6,326,244 B1 | 12/2001 | Brooks et al. |
| 6,326,689 B1 | 12/2001 | Thomas |
| 6,338,980 B1 | 1/2002 | Satoh |
| 6,351,030 B2 | 2/2002 | Havens et al. |
| 6,472,746 B2 | 10/2002 | Taniguchi et al. |
| 6,476,467 B2 | 11/2002 | Nakamura et al. |
| 6,569,709 B2 | 5/2003 | Derderian |
| D475,981 S | 6/2003 | Michii |
| 6,580,165 B1 | 6/2003 | Singh |
| 6,582,992 B2 | 6/2003 | Poo et al. |
| 6,593,648 B2 | 7/2003 | Emoto |
| 6,607,938 B2 | 8/2003 | Kwon et al. |
| 6,607,941 B2 | 8/2003 | Prabhu et al. |
| 6,621,155 B1 | 9/2003 | Perino et al. |
| 6,621,172 B2 | 9/2003 | Nakayama et al. |
| 6,624,505 B2 | 9/2003 | Badehi |
| 6,656,827 B1 | 12/2003 | Tsao et al. |
| 6,667,543 B1 | 12/2003 | Chow et al. |
| 6,670,701 B2 | 12/2003 | Matsuura et al. |
| 6,674,159 B1 | 1/2004 | Peterson et al. |
| 6,686,655 B2 | 2/2004 | Moden et al. |
| 6,706,971 B2 | 3/2004 | Albert et al. |
| 6,722,213 B2 | 4/2004 | Offen et al. |
| 6,730,997 B2 | 5/2004 | Beyne et al. |
| 6,737,743 B2 | 5/2004 | Urakawa |
| 6,747,348 B2 | 6/2004 | Jeung et al. |
| 6,750,547 B2 | 6/2004 | Jeung et al. |
| 6,756,252 B2 | 6/2004 | Nakanishi |
| 6,777,767 B2 | 8/2004 | Badehi |
| 6,802,446 B2 | 10/2004 | Chaudhuri et al. |
| 6,844,623 B1 | 1/2005 | Peterson et al. |
| 6,849,802 B2 | 2/2005 | Song et al. |
| 6,908,784 B1 | 6/2005 | Farnworth et al. |
| 6,910,268 B2 | 6/2005 | Miller |
| 6,940,022 B1 | 9/2005 | Vinciarelli et al. |
| 6,956,283 B1 | 10/2005 | Peterson |
| 6,964,915 B2 | 11/2005 | Farnworth et al. |
| 6,972,480 B2 | 12/2005 | Zilber et al. |
| 6,973,718 B2 | 12/2005 | Sheppard, Jr. et al. |
| 6,984,885 B1 | 1/2006 | Harada et al. |
| 7,005,324 B2 | 2/2006 | Imai |
| 7,029,949 B2 | 4/2006 | Farnworth et al. |
| 7,061,125 B2 | 6/2006 | Cho et al. |
| 7,115,986 B2 | 10/2006 | Moon et al. |
| 7,180,168 B2 | 2/2007 | Imai |
| 7,190,060 B1 | 3/2007 | Chiang |
| 7,196,262 B2 | 3/2007 | Gronet |
| 7,208,335 B2 | 4/2007 | Boon et al. |
| 7,208,345 B2 | 4/2007 | Meyer et al. |
| 7,215,018 B2 | 5/2007 | Vindasius et al. |
| 7,221,051 B2 | 5/2007 | Ono et al. |
| 7,245,021 B2 | 7/2007 | Vindasius et al. |
| 7,259,455 B2 | 8/2007 | Seto |
| 7,279,363 B2 | 10/2007 | Cherukuri et al. |
| 7,285,865 B2 | 10/2007 | Kwon et al. |
| 7,335,533 B2 | 2/2008 | Derderian |
| 7,355,274 B2 | 4/2008 | Lim |
| 7,405,138 B2 | 7/2008 | Ohuchi et al. |
| 7,408,243 B2 | 8/2008 | Shiffer |
| 7,452,743 B2 | 11/2008 | Oliver et al. |
| 7,514,350 B2 | 4/2009 | Hashimoto |
| 7,521,288 B2 | 4/2009 | Arai et al. |
| 7,535,109 B2 | 5/2009 | Robinson et al. |
| 7,564,142 B2 | 7/2009 | Hashimoto |
| 7,595,222 B2 | 9/2009 | Shimoishizaka et al. |
| 7,601,039 B2 | 10/2009 | Eldridge et al. |
| 7,638,869 B2 | 12/2009 | Irsigler et al. |
| 7,662,670 B2 | 2/2010 | Noma et al. |
| 7,662,671 B2 | 2/2010 | Saeki |
| 7,704,794 B2 | 4/2010 | Mess et al. |
| 7,732,912 B2 | 6/2010 | Damberg |
| 7,768,795 B2 | 8/2010 | Sakurai et al. |
| 7,829,438 B2 | 11/2010 | Haba et al. |
| 7,863,159 B2 | 1/2011 | Co et al. |
| 7,888,185 B2 | 2/2011 | Corisis et al. |
| 7,901,989 B2 | 3/2011 | Haba et al. |
| 7,919,846 B2 | 4/2011 | Hembree |
| 7,923,349 B2 | 4/2011 | McElrea et al. |
| 7,952,195 B2 | 5/2011 | Haba |
| 8,022,527 B2 | 9/2011 | Haba et al. |
| 8,076,788 B2 | 12/2011 | Haba et al. |
| 2001/0012725 A1 | 8/2001 | Maeda et al. |
| 2001/0031548 A1 | 10/2001 | Elenius et al. |
| 2002/0006686 A1 | 1/2002 | Cloud et al. |
| 2002/0027257 A1 | 3/2002 | Kinsman et al. |
| 2002/0045290 A1 | 4/2002 | Ball |
| 2002/0096349 A1 | 7/2002 | Hedler et al. |
| 2002/0127775 A1 | 9/2002 | Haba et al. |
| 2002/0168798 A1 | 11/2002 | Glenn et al. |
| 2002/0180010 A1 | 12/2002 | Tsubosaki et al. |
| 2002/0185725 A1 | 12/2002 | Moden et al. |
| 2002/0187260 A1 | 12/2002 | Sheppard et al. |
| 2002/0190368 A1 | 12/2002 | Shimoe et al. |
| 2003/0038353 A1 | 2/2003 | Derderian |
| 2003/0038356 A1 | 2/2003 | Derderian |
| 2003/0038357 A1 | 2/2003 | Derderian |
| 2003/0060034 A1 | 3/2003 | Beyne et al. |
| 2003/0071338 A1 | 4/2003 | Jeung et al. |
| 2003/0071341 A1 | 4/2003 | Jeung et al. |
| 2003/0080403 A1 | 5/2003 | Jeung et al. |
| 2003/0092326 A1 | 5/2003 | Nishikawa et al. |
| 2003/0096454 A1 | 5/2003 | Poo et al. |
| 2003/0099085 A1 | 5/2003 | Duva |
| 2003/0122243 A1 | 7/2003 | Lee et al. |
| 2003/0143819 A1 | 7/2003 | Hedler et al. |
| 2003/0162369 A1 | 8/2003 | Kobayashi |
| 2003/0209772 A1 | 11/2003 | Prabhu |
| 2004/0113283 A1 | 6/2004 | Farnworth et al. |
| 2004/0142509 A1 | 7/2004 | Imai |

(56) References Cited

U.S. PATENT DOCUMENTS

| | | |
|---|---|---|
| 2004/0150095 A1 | 8/2004 | Fraley et al. |
| 2004/0173892 A1 | 9/2004 | Nakanishi |
| 2004/0195667 A1 | 10/2004 | Karnezos |
| 2004/0198033 A1 | 10/2004 | Lee et al. |
| 2004/0212083 A1 | 10/2004 | Yang |
| 2004/0217446 A1 | 11/2004 | Headley et al. |
| 2004/0227235 A1 | 11/2004 | Hashimoto |
| 2004/0238933 A1 | 12/2004 | Chen et al. |
| 2004/0251520 A1 | 12/2004 | Sasaki et al. |
| 2004/0262035 A1 | 12/2004 | Ko et al. |
| 2005/0013927 A1 | 1/2005 | Yamazaki |
| 2005/0067680 A1 | 3/2005 | Boon et al. |
| 2005/0067694 A1 | 3/2005 | Pon et al. |
| 2005/0082651 A1 | 4/2005 | Farnworth et al. |
| 2005/0085050 A1 | 4/2005 | Draney et al. |
| 2005/0101039 A1 | 5/2005 | Chen et al. |
| 2005/0104179 A1 | 5/2005 | Zilber et al. |
| 2005/0148160 A1 | 7/2005 | Farnworth et al. |
| 2005/0156323 A1 | 7/2005 | Tokunaga |
| 2005/0230802 A1 | 10/2005 | Vindasius et al. |
| 2005/0248021 A1 | 11/2005 | Morkner |
| 2005/0258530 A1 | 11/2005 | Vindasius et al. |
| 2005/0287705 A1 | 12/2005 | Yang |
| 2005/0287709 A1 | 12/2005 | Lee et al. |
| 2006/0003552 A1 | 1/2006 | Okada |
| 2006/0035408 A1 | 2/2006 | Derderian |
| 2006/0046436 A1 | 3/2006 | Ohuchi et al. |
| 2006/0055050 A1 | 3/2006 | Numata et al. |
| 2006/0068567 A1 | 3/2006 | Beyne et al. |
| 2006/0076690 A1 | 4/2006 | Khandros et al. |
| 2006/0094165 A1 | 5/2006 | Hedler et al. |
| 2006/0097356 A1 | 5/2006 | Fujii et al. |
| 2006/0103000 A1 | 5/2006 | Kurosawa |
| 2006/0121645 A1 | 6/2006 | Ball |
| 2006/0138626 A1 | 6/2006 | Liew et al. |
| 2006/0220262 A1 | 10/2006 | Meyer et al. |
| 2006/0267173 A1 | 11/2006 | Takiar et al. |
| 2006/0273365 A1 | 12/2006 | Cross et al. |
| 2006/0278971 A1 | 12/2006 | Barnes et al. |
| 2007/0023900 A1 | 2/2007 | Toyoda |
| 2007/0029684 A1 | 2/2007 | Arai et al. |
| 2007/0065987 A1 | 3/2007 | Mess et al. |
| 2007/0102801 A1 | 5/2007 | Ishida et al. |
| 2007/0132082 A1 | 6/2007 | Tang et al. |
| 2007/0158799 A1 | 7/2007 | Chiu et al. |
| 2007/0158807 A1 | 7/2007 | Lu et al. |
| 2007/0170572 A1 | 7/2007 | Liu et al. |
| 2007/0181989 A1 | 8/2007 | Corisis et al. |
| 2007/0187811 A1 | 8/2007 | Arai et al. |
| 2007/0194462 A1 | 8/2007 | Kim et al. |
| 2007/0222054 A1 | 9/2007 | Hembree |
| 2007/0252262 A1 | 11/2007 | Robinson et al. |
| 2007/0284716 A1 | 12/2007 | Vindasius et al. |
| 2008/0083976 A1 | 4/2008 | Haba et al. |
| 2008/0083977 A1 | 4/2008 | Haba et al. |
| 2008/0112150 A1 | 5/2008 | Jones |
| 2008/0166836 A1 | 7/2008 | Jobetto |
| 2008/0173792 A1 | 7/2008 | Yang et al. |
| 2008/0180242 A1 | 7/2008 | Cottingham |
| 2008/0203566 A1 | 8/2008 | Su |
| 2008/0206915 A1 | 8/2008 | Yamazaki |
| 2008/0208043 A1 | 8/2008 | Smith et al. |
| 2008/0251913 A1 | 10/2008 | Inomata |
| 2008/0251939 A1 | 10/2008 | Chung et al. |
| 2008/0284044 A1 | 11/2008 | Myers |
| 2008/0290493 A1* | 11/2008 | Tsunozaki ............ 257/686 |
| 2008/0303131 A1* | 12/2008 | McElrea et al. ............ 257/686 |
| 2008/0308921 A1 | 12/2008 | Kim |
| 2008/0315407 A1 | 12/2008 | Andrews, Jr. et al. |
| 2009/0020887 A1 | 1/2009 | Mizuno et al. |
| 2009/0020889 A1 | 1/2009 | Murayama et al. |
| 2009/0065948 A1 | 3/2009 | Wang |
| 2009/0102038 A1 | 4/2009 | McElrea et al. |
| 2009/0146137 A1* | 6/2009 | Kim et al. ............ 257/40 |
| 2009/0160065 A1 | 6/2009 | Haba et al. |
| 2009/0230528 A1 | 9/2009 | McElrea et al. |
| 2009/0316378 A1 | 12/2009 | Haba et al. |
| 2010/0140753 A1 | 6/2010 | Hembree |
| 2010/0140811 A1 | 6/2010 | Leal et al. |
| 2010/0148352 A1 | 6/2010 | Moden |
| 2010/0207277 A1 | 8/2010 | Bauer et al. |
| 2011/0006432 A1 | 1/2011 | Haba et al. |
| 2011/0031629 A1 | 2/2011 | Haba et al. |
| 2011/0033979 A1 | 2/2011 | Haba et al. |
| 2011/0049696 A1 | 3/2011 | Haba et al. |
| 2011/0187007 A1 | 8/2011 | Haba et al. |
| 2011/0248410 A1 | 10/2011 | Avsian et al. |
| 2012/0061846 A1* | 3/2012 | Rathbun ............ 257/773 |
| 2012/0080807 A1 | 4/2012 | Haba et al. |
| 2012/0133057 A1 | 5/2012 | Haba et al. |
| 2013/0099392 A1 | 4/2013 | McElrea et al. |
| 2013/0119542 A1 | 5/2013 | Oh |
| 2013/0154117 A1 | 6/2013 | Tan et al. |

FOREIGN PATENT DOCUMENTS

| | | |
|---|---|---|
| CN | 1638118 A | 7/2005 |
| CN | 1905148 A | 1/2007 |
| DE | 102004039906 A1 | 8/2005 |
| EP | 1041624 A1 | 10/2000 |
| EP | 1763894 A2 | 3/2007 |
| FR | 2704690 A1 | 11/1994 |
| JP | 07-509104 A | 10/1995 |
| JP | 11-260851 A | 9/1999 |
| JP | 2000269411 A | 9/2000 |
| JP | 2001210782 A | 8/2001 |
| JP | 2003-142518 A | 5/2003 |
| JP | 2003163324 A | 6/2003 |
| JP | 2004-119473 | 4/2004 |
| JP | 2004153130 A | 5/2004 |
| JP | 2004158536 A | 6/2004 |
| JP | 2004-214548 A | 7/2004 |
| JP | 2005005529 A | 1/2005 |
| JP | 2005026564 A | 1/2005 |
| JP | 2006-351793 A | 12/2006 |
| JP | 2007073803 A | 3/2007 |
| JP | 2007523482 A | 8/2007 |
| JP | 2008205453 A | 9/2008 |
| JP | 2008236688 A | 10/2008 |
| JP | 2009-026969 | 2/2009 |
| JP | 2009027039 A | 2/2009 |
| KR | 20-1994-0004952 | 7/1994 |
| KR | 10-1999-0008537 | 2/1999 |
| KR | 20010062722 A | 7/2001 |
| KR | 20050009036 A | 1/2005 |
| KR | 20070018057 A | 2/2007 |
| KR | 100813624 B1 | 3/2008 |
| KR | 20080045259 A | 5/2008 |
| KR | 20080069549 A | 7/2008 |
| KR | 20080091980 | 10/2008 |
| TW | 475244 | 2/2002 |
| TW | 200425356 A | 11/2004 |
| TW | 200504995 A | 2/2005 |
| TW | 200527549 A | 8/2005 |
| TW | 200605298 A | 2/2006 |
| TW | 200721471 | 6/2007 |
| TW | 200940570 A | 10/2009 |
| WO | 9425987 A1 | 11/1994 |
| WO | 9907015 A1 | 2/1999 |
| WO | 9909599 A2 | 2/1999 |
| WO | 0164344 A2 | 9/2001 |
| WO | 2005081315 A2 | 9/2005 |
| WO | 2005101492 A2 | 10/2005 |
| WO | 2009032371 A1 | 3/2009 |
| WO | 2009052150 A1 | 4/2009 |
| WO | 2009114670 A2 | 9/2009 |

OTHER PUBLICATIONS

Notice to File Corrected Papers, mailed Mar. 30, 2007, U.S. Appl. No. 11/097,829.

Office Action (Restriction) mailed Jan. 21, 2010, U.S. Appl. No. 12/046,651.

(56) References Cited

OTHER PUBLICATIONS

Office Action (Restriction) mailed Oct. 7, 2009, U.S. Appl. No. 11/849,162.
Office Action (Restriction) mailed Oct. 7, 2009, U.S. Appl. No. 12/143,157.
Office Action (Restriction) mailed Dec. 28, 2010, U.S. Appl. No. 12/403,175.
Office Action (Restriction) mailed Mar. 4, 2010, U.S. Appl. No. 12/251,624.
Office Action (Restriction) mailed Apr. 20, 2009, U.S. Appl. No. 11/744,142.
Office Action (Restriction) mailed May 24, 2010, U.S. Appl. No. 12/124,097.
Office Action (Restriction) mailed Jun/ 24, 2009, U.S. Appl. No. 11/849,162.
Office Action (Restriction) mailed Feb. 4, 2010, U.S. Appl. No. 12/251,624.
Office Action mailed Jan. 27, 2009, U.S. Appl. No. 11/849,162.
Office Action mailed Oct. 14, 2010, U.S. Appl. No. 12/124,097.
Office Action mailed Dec. 15, 2008, U.S. Appl. No. 11/016,558.
Office Action mailed Dec. 22, 2006, U.S. Appl. No. 11/016,558.
Office Action mailed Dec. 30, 2009, U.S. Appl. No. 12/143,157.
Office Action mailed Dec. 31, 2007, U.S. Appl. No. 11/744,153.
Office Action mailed Feb. 7, 2006, U.S. Appl. No. 11/097,829.
Office Action mailed 217106, U.S. Appl. No. 11/097,829.
Office Action mailed Mar. 1, 2011, U.S. Appl. No. 12/143,157.
Office Action mailed Mar. 19, 2008, EP Application No. 05736129.7.
Office Action mailed Mar. 27, 2008, U.S. Appl. No. 11/016,558.
Office Action mailed Jun. 9, 2010, U.S. Appl. No. 12/251,624.
Office Action mailed Jul. 15, 2009, U.S. Appl. No. 11/016,558.
Office Action mailed Jul. 21, 2010, U.S. Appl. No. 11/849,162.
Office Action mailed Aug. 18, 2010, U.S. Appl. No. 12/046,651.
Office Action mailed Aug. 3, 2009, U.S. Appl. No. 11/744,142.
Office Action mailed Aug. 3, 2009, U.S. Appl. No. 111744,142.
Response filed Oct. 19, 2007 to Oct. 10, 2007 Advisory Action, U.S. Appl. No. 11/016,558.
Response filed Aug. 5, 2009 in response to Jul. 15, 2009 Office Action, U.S. Appl. No. 11/016,558.
Supplemental Amendement filed Aug. 5, 2009, U.S. Appl. No. 11/849,162.
U.S. Appl. No. 12/124,097, filed May 20, 2008.
Written Opinion of the International Searching Authority for Application No. No. PCT/US2010/055472 dated Jul. 27, 2011.
Written Opinion of the International Searching Authority for Application No. PCT/US2009/067386 dated Jul. 1, 2010.
Written Opinion of the International Searching Authority for Application No. PCT/US2010/039639 dated Jan. 26, 2011.
Amendment filed Jun. 26, 2010 in response to May 24, 2010 Office Action, U.S. Appl. No. 12/124,097.
Amendment filed Jun. 30, 2009 in response to Dec. 30, 2009 Office Action, U.S. Appl. No. 12/143,157.
Amendment filed Mar. 4, 2010 in response to Feb. 4, 2010 Office Action, U.S. Appl. No. 12/251,624.
Amendment filed May 22, 2009 in response to Apr. 20, 2009 Office Action, U.S. Appl. No. 11/744,142.
Amendment filed May 29, 2007 in response to Mar. 30, 2007 Notice, U.S. Appl. No. 11/097,829.
Amendment filed Nov. 9, 2009 in response to Oct. 7, 2009 Office Action, U.S. Appl. No. 12/143,157.
Amendment filed Oct. 1, 2008 in response to Jul. 1, 2010 Office Action, U.S. Appl. No. 11/744,153.
EP Supplemental Search Report mailed Nov. 5, 2007, EP Application No. 05736129.7.
EP Supplementary Search Report dated Jun. 5, 2008 and mailed Jun. 12, 2008 for EP App. No. 05735136.3.
EP Supplementary Search Report mailed Jun. 5, 2008, EP App. No. 05735136.3.
Ex Parte Quayle Action mailed 217/06, U.S. Appl. No. 11/090,969.
Final Office Action mailed 118/07, U.S. Appl. No. 11/097,829.
Final Office Action mailed Mar. 1, 2011, U.S. Appl. No. 12/251,624.
Final Office Action mailed Mar. 18, 2010, U.S. Appl. No. 11/744,142.
Final Office Action mailed Jul. 1, 2010, U.S. Appl. No. 11/744,153.
Final Office Action mailed Jul. 19, 2007, U.S. Appl. No. 11/016,558.
Final Office Action mailed Sep. 15, 2008, U.S. Appl. No. 11/016,558.
Final Office Action mailed Jan. 8, 2007, U.S. Appl. No. 11/097,829.
Final Office Action, mailed Aug. 5, 2010, U.S. Appl. No. 12/143,157.
International Search Report & Wrillen Opinion, Application N90. PCT/US2008/066561, dated Dec. 31, 2008.
International Search Report and Wrillen Opinion, Appl. No. PCTIUS2008/067722, dated Feb. 25, 2009.
International Search Report and Written Opinion dated Apr. 12, 2010, App. No. PCTIUS2009/55421.
International Search Report and Written Opinion dated Mar. 17, 2009, App. No. PCTIUS2008/079948.
International Search Report and Written Opinion dated Jan. 26, 2011, App. No. PCT/US2010/39639.
International Search Report and Written Opinion dated Mar. 6, 2009, App. No. PCT/US2008/173365.
International Search Report and Written Opinion dated Oct. 6, 2009 , App. No. PCTIUS2009/36921.
International Search Report and Written Opinion for Application No. PCT/US2009/047389 dated Jan. 14, 2010.
International Search Report and Written Opinion for Application No. PCT/US20101054325 dated Jul. 28, 2011.
International Search Report and Written Opinion for PCT Application No. PCT/US2008/065788, mailed Sep. 30, 2008.
International Search Report for Application No. PCT/US2009/067386 dated Jul. 1, 2010.
International Search Report for Application No. PCT/US2010/039639 dated Jan. 26, 2011.
International Search Report for Application No. PCT/US2010/055472 dated Jul. 27, 2011.
International Search Report for PCT Application No. PCT/US2008/065793, mailed Dec. 22, 2008.
International Search Report mailed Mar. 23, 2009, International Application No. PCT/US2008/74450.
Ko, et al. Development of three-dimensional memory die stack packages using polymer insulated sidewall technique, 1999.
Notice of Allowability, mailed Oct. 19, 2006, U.S. Appl. No. 11/090,969.
Notice of Allowability, mailed Oct. 19, 2006 U.S. Appl. No. 11/090,969.
Notice of Allowance mailed Dec. 17, 2009, U.S. Appl. No. 11/016,558.
Notice of Allowance mailed Feb. 27, 2009, U.S. Appl. No. 11/744,153.
Notice of Allowance, mailed Feb. 12, 2007, U.S. Appl. No. 11/097,829.
Advisory Action mailed Oct. 10, 2007, U.S. Appl. No. 11/016,558.
Advisory Action, mailed Oct. 20, 2008, U.S. Appl. No. 11/744,153.
Amendment A filed Aug. 7, 2006 in response to Feb. 7, 2006 Office Action, U.S. Appl. No. 11/097,829.
Amendment A filed Aug. 7, 2006 in response to Feb. 7, 2006 Quayle Action, U.S. Appl. No. 11/090,969.
Amendment and RCE filed Nov. 26, 2008 in response to Oct. 20, 2008 Advisory Action, U.S. Appl. No. 11/744,153.
Amendment and RCE filed Feb. 7, 2011 in repsonse to Aug. 5, 2010 Office Action, U.S. Appl. No. 12/143,157.
Amendment and RCE filed Mar. 16, 2011 in response to Mar. 18, 2010 Office Action, U.S. Appl. No. 11/1744,142.
Amendment and RCE filed Mar. 16, 2011 in response to Mar. 18, 2010 Office Action, U.S. Appl. No. 11/744,142.
Amendment filed Jan. 18, 2011 in response to Aug. 18, 2010 Office Action, U.S. Appl. No. 12/046,651.
Amendment filed Jan. 21, 2011 in response to Jul. 21, 2010 Office Action, U.S. Appl. No. 11/849,162.
Amendment filed Jan. 22, 2007 in response to Jul. 19, 2007 Office Action, U.S. Appl. No. 11/016,558.
Amendment filed Jan. 24, 2007 in response to Jan. 8, 2007 Office Action, U.S. Appl. No. 111097,829.
Amendment filed Jan. 29, 2010 in response to Dec. 28, 2010 Office Action, U.S. Appl. No. 12/403,175.

(56) References Cited

OTHER PUBLICATIONS

Amendment filed 10/1108 in response to Jul. 1, 2010 Office Action, U.S. Appl. No. 111744,153.
Amendment filed Oct. 14, 2008 in response to Sep. 15, 2008 Office Action, U.S. Appl. No. 11/016,558.
Amendment filed Nov. 9, 2009 in response to Oct. 7, 2009 Office Action, U.S. Appl. No. 11/849,162.
Amendment filed Dec. 3, 2009 in response to Aug. 3, 2009 Office Action, U.S. Appl. No. 11/744,142.
Amendment filed Dec. 3, 2009 in response to 813109 Office Action, U.S. Appl. No. 11/744,142.
Amendment filed Dec. 9, 2010 in response to Jun. 9, 2010 Office Action, U.S. Appl. No. 12/251,624.
Amendment filed Feb. 14, 2011 in response to Oct. 14, 2010 Office Action, U.S. Appl. No. 12/124,097.
Amendment filed Feb. 22, 2010 in response to Feb. 21, 2010 Office Action, U.S. Appl. No. 12/046,651.
Amendment filed Mar. 27, 2009 in response to Nov. 27, 2009 Office Action, U.S. Appl. No. 11/849,162.
Amendment filed Apr. 1, 2008 in response to Dec. 31, 2007 Office Action , U.S. Appl. No. 11/744,153.
Amendment filed 4/1108 in response to Dec. 31, 2007 Office Action, U.S. Appl. No. 11/744,153.
Amendment filed Apr. 8, 2009 in response to Dec. 15, 2008 Office Action, U.S. Appl. No. 11/016,558.
Amendment filed Jun. 21, 2007 in response to Dec. 22, 2006 Office Action, U.S. Appl. No. 11/016,558.
Amendment filed Jun. 27, 2008 in response to Mar. 27, 2008 Office Action, U.S. Appl. No. 11/016,558.
Amendment filed Jul. 26, 2010 in response to May 24, 2010 Office Action, U.S. Appl. No. 12/124,097.
Amendment filed Jul. 8, 2009 in response to Jun. 24, 2009 Office Action, U.S. Appl. No. 11/849,162.
Amendment filed Sep. 19, 2007 in response to Jul. 19, 2007 Office Action, U.S. Appl. No. 11/016,558.
Amendment filed Apr. 11, 2008 in response to Dec. 31, 2007 Office Action, U.S. Appl. No. 11/744,153.
Amendment filed Jan. 24, 2007 in response to Jan. 8, 2007 Office Action, U.S. Appl. No. 11/097,829.
Japanese Office Action for Application No. 2010-550853 dated Sep. 18, 2013.
Taiwanese Office Action for Application No. 098108067 dated Dec. 25, 2013.
Chinese Office Action for Application No. 200980149285.2 dated Feb. 28, 2014.
Japanese Office Action for Application No. 2011540873 dated Jan. 22, 2014.
Amendment filed Mar. 1, 2010, U.S. Appl. No. 12/142,589, in response to Office Action mailed Dec. 1, 2009.
Chinese Office Action for Application No. 201080035256.6 dated Jul. 17, 2014.
International Preliminary Report on Patentability for Application PCT/US2008/067541 mailed Jan. 7, 2010.
International Search Report and Written Opinion for Application No. PCT/US08/09207 dated Jan. 16, 2009.
International Search Report and Written Opnion for Application PCT/US2007/021552 dated May 29, 2008.
International Search Report for Application No. PCT/US2009/003643 dated Aug. 28, 2009.
International Search Report for PCT Application No. PCT/US2008/067541 mailed Oct. 27, 2008.
Japanese Office Action for Application No. 2012-517680 dated Jul. 25, 2014.
Office Action mailed Dec. 1, 2009, U.S. Appl. No. 12/142,589, titled "Wafer level surface passivation of stackable integrated circuit chips".
Taiwanese Office Action for Application No. 098119939 dated Aug. 29, 2014.
Chinese Office Action for Application No. 201180031606.6 dated Dec. 11, 2014.
Taiwanese Office Action for Application No. 099136720 dated May 18, 2015.

* cited by examiner

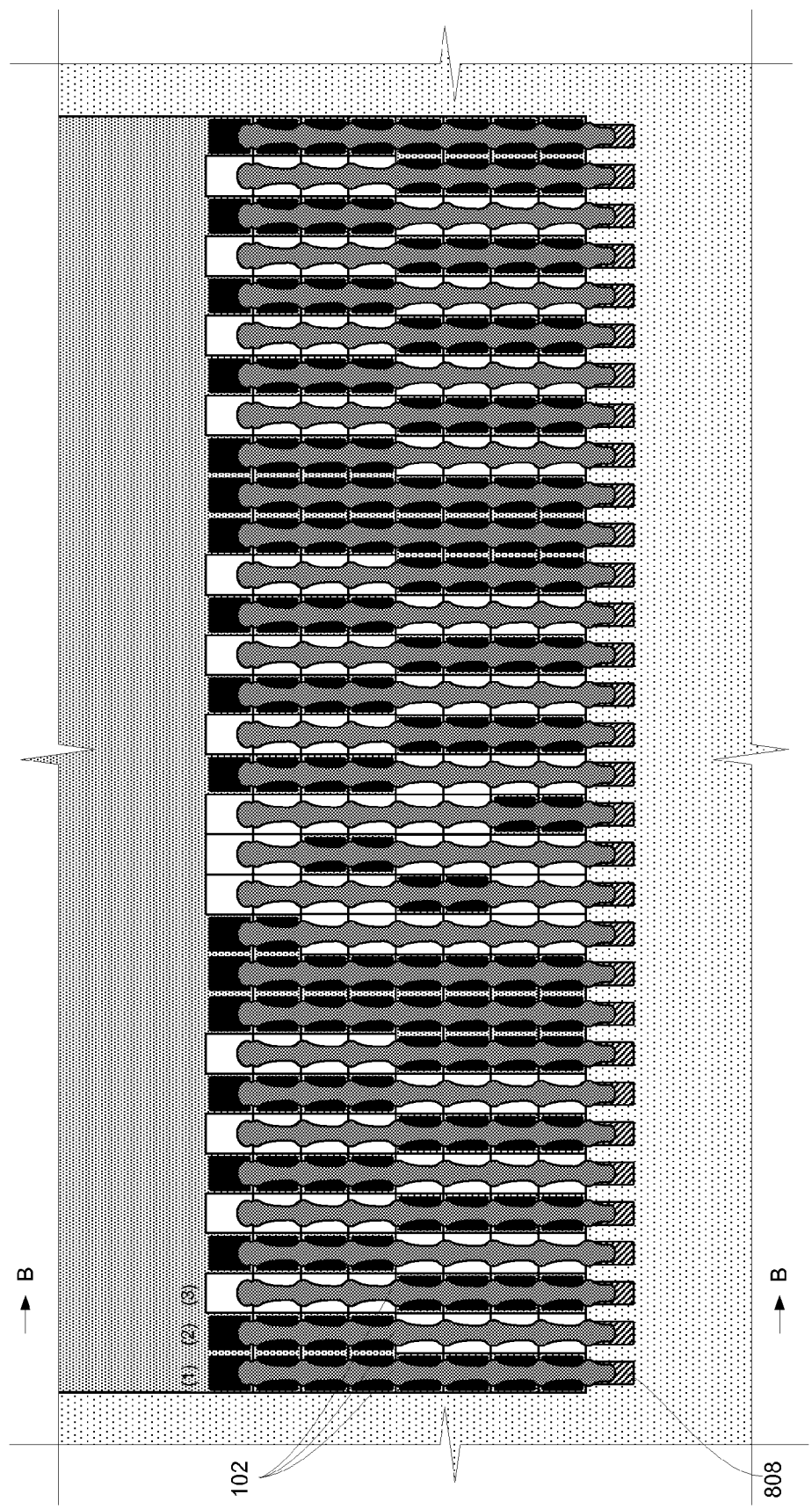

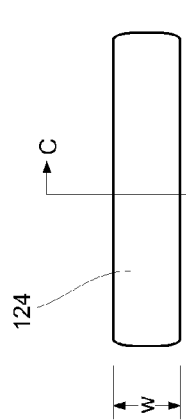
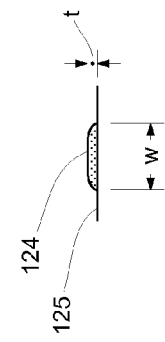
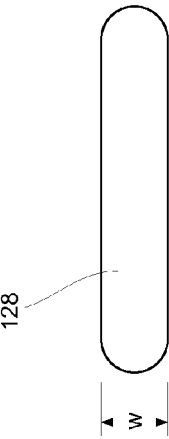
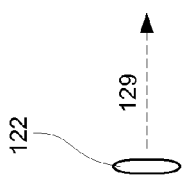
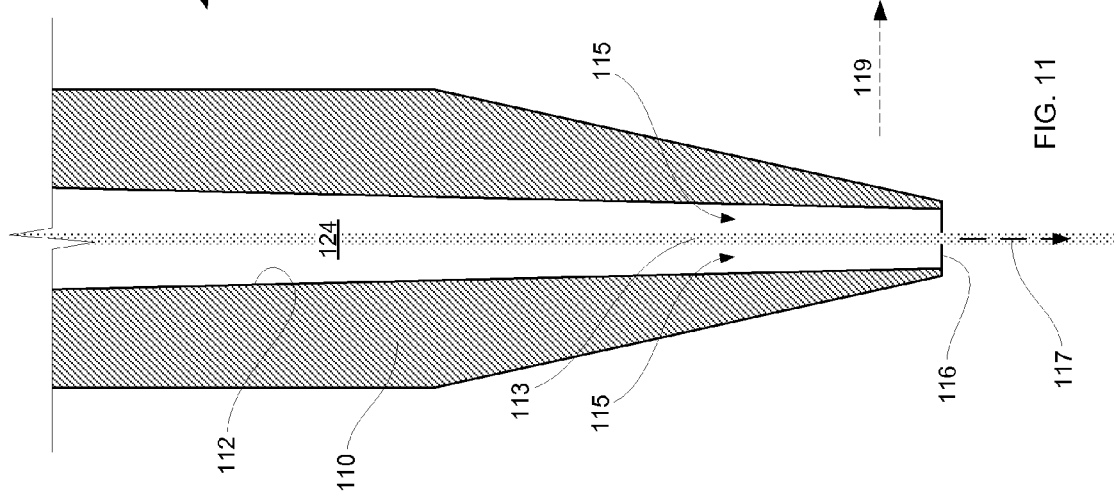

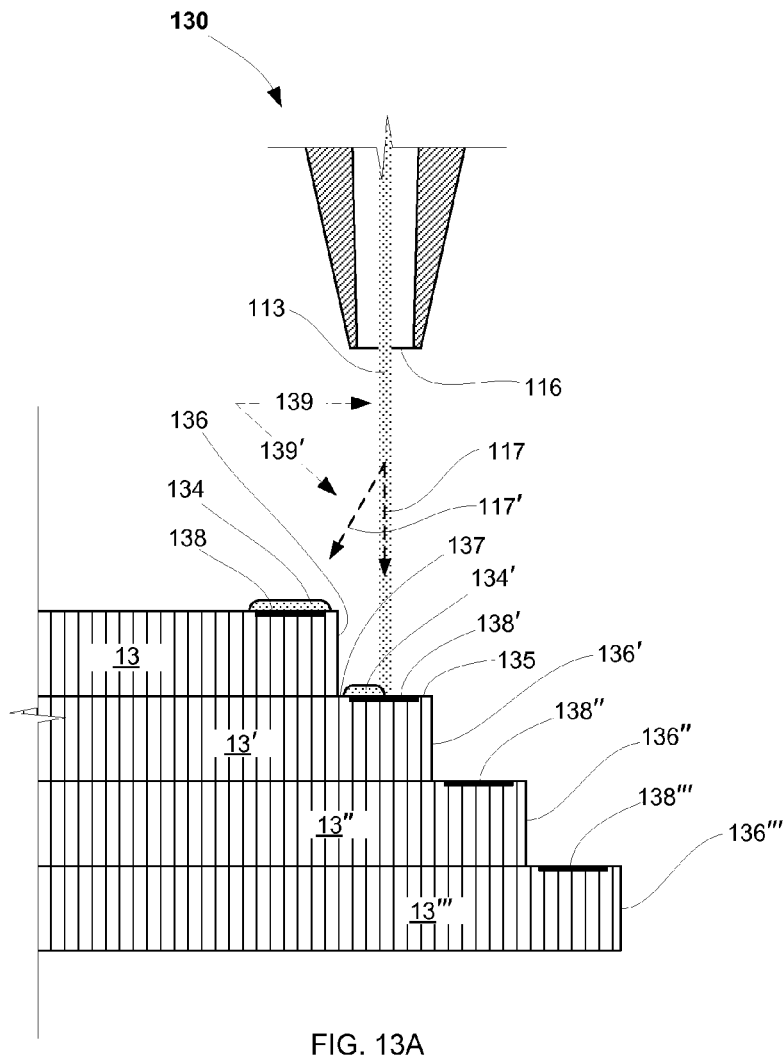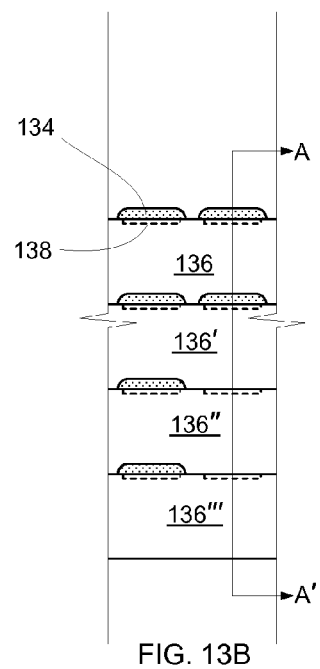
FIG. 13A
FIG. 13B
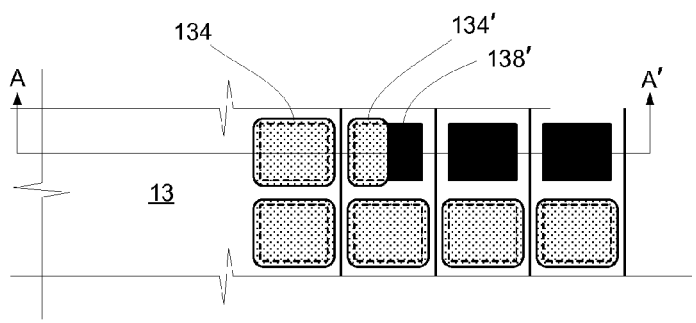
FIG. 13C

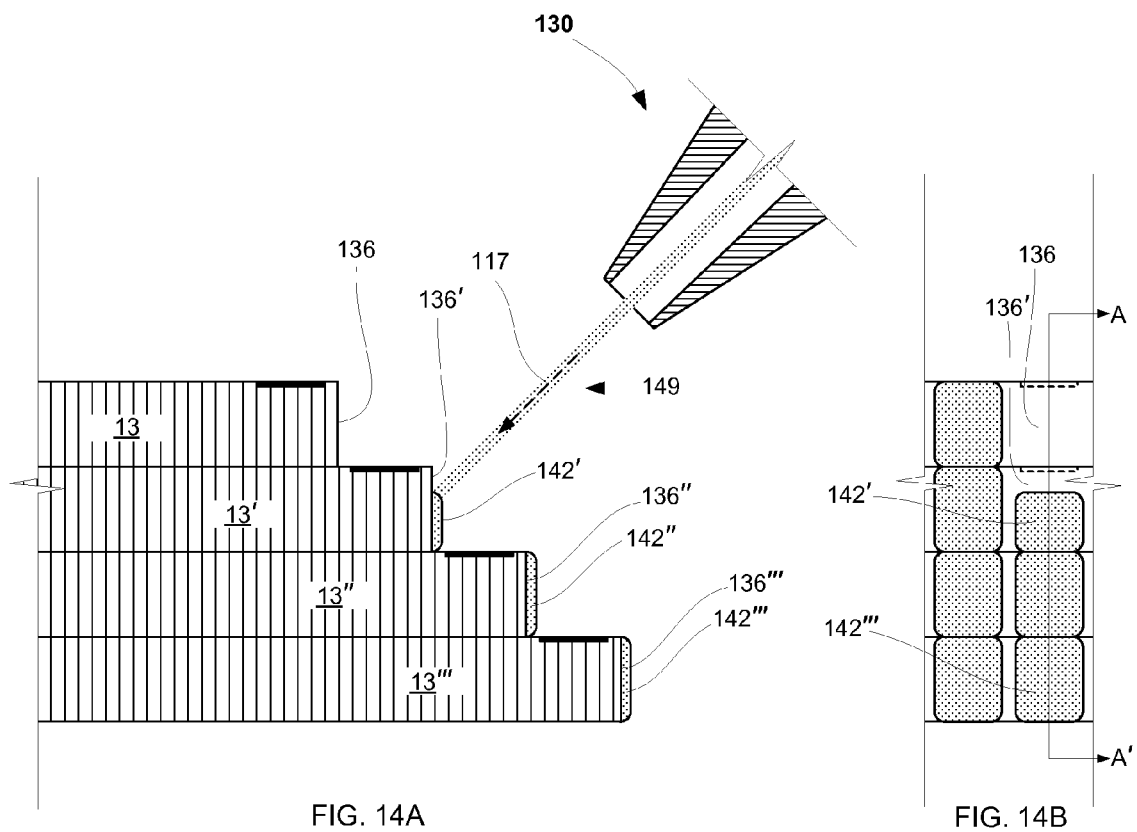
FIG. 14A
FIG. 14B
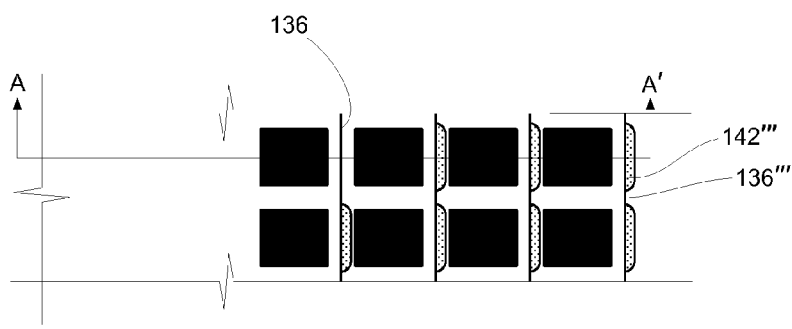
FIG. 14C

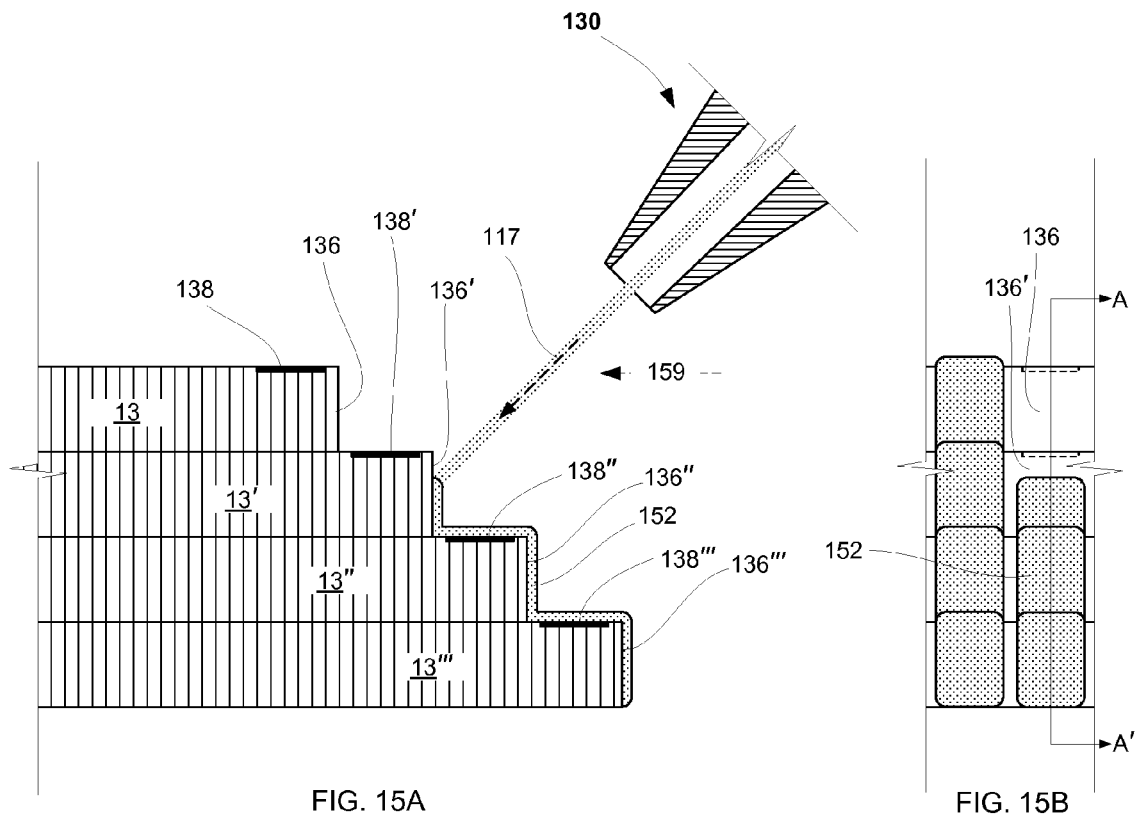
FIG. 15A
FIG. 15B
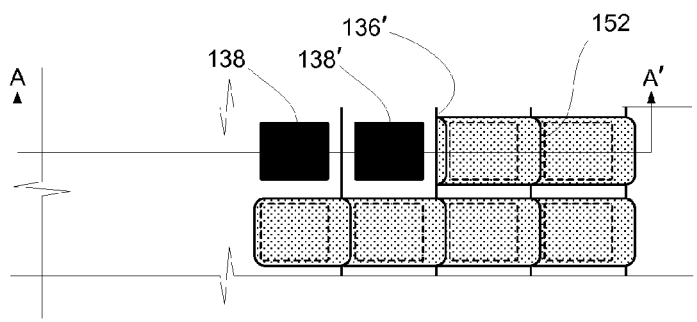
FIG. 15C

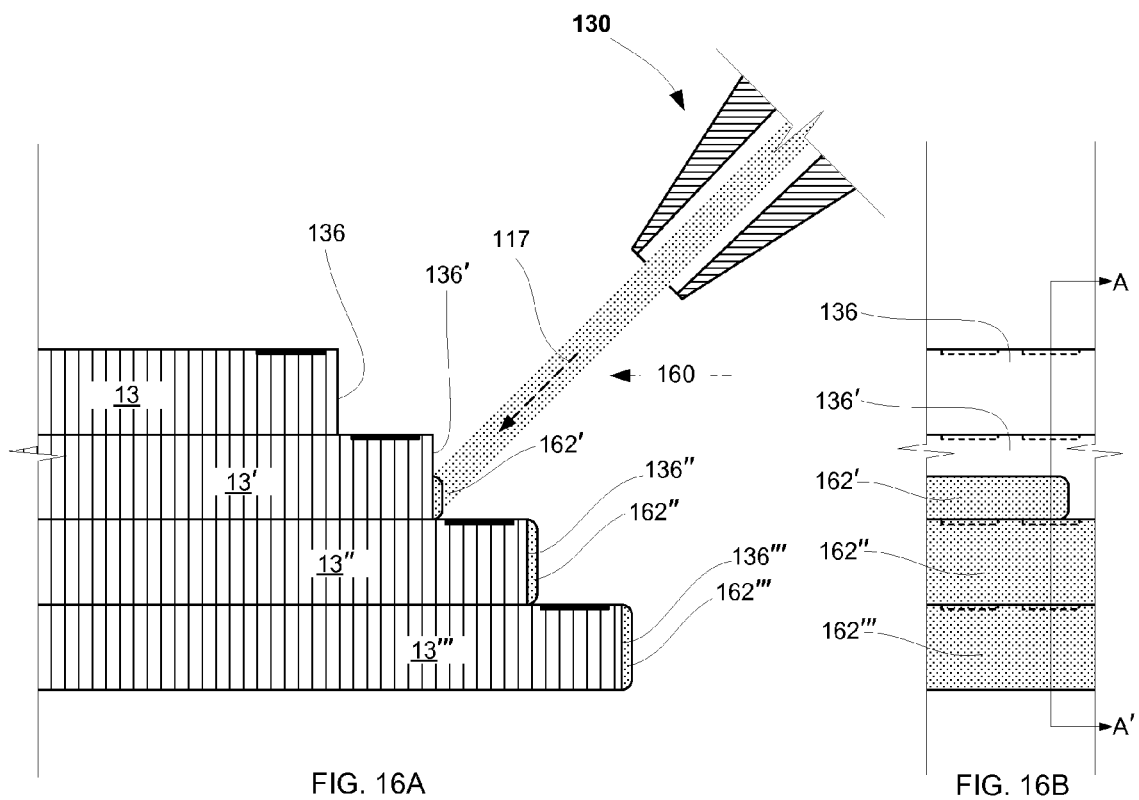
FIG. 16A
FIG. 16B
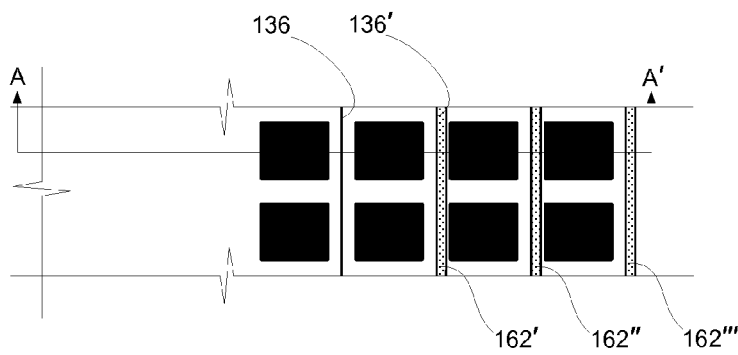
FIG. 16C

SELECTIVE DIE ELECTRICAL INSULATION BY ADDITIVE PROCESS

CROSS-REFERENCE TO RELATED APPLICATION

This application claims priority from Jeffrey S. Leal U.S. Provisional Application No. 61/255,429, titled "Selective die electrical insulation by additive process", which was filed Oct. 27, 2009, and which is incorporated by reference herein.

BACKGROUND

This invention relates to electrical interconnection of integrated circuit chips and, particularly, to interconnection of stacked die.

A typical semiconductor die has a front ("active") side, in which the integrated circuitry is formed, a back side, and sidewalls. The sidewalls meet the front side at front edges and the back side at back edges. Semiconductor die typically are provided with interconnect pads (die pads) located at the front side for electrical interconnection of the circuitry on the die with other circuitry in the device in which the die is deployed. Some die as provided have die pads on the front side along one or more of the die margins, and these may be referred to as peripheral pad die. Other die as provided have die pads arranged in one or two rows at the front side near the center of the die, and these may be referred to as central pad die. The die may be "rerouted" to provide a suitable arrangement of interconnect pads at or near one or more of the margins of the die. A die margin along which interconnect pads are arranged may be referred to as an "interconnect margin", the adjacent front die edge may be referred to as an "interconnectedge", and a die sidewall adjacent an interconnect die edge may be referred to as an "interconnect sidewall".

Semiconductor die may be electrically connected with other circuitry, for example in a printed circuit board, a package substrate or leadframe, or another die, by any of several means. Connection may be made, for example, by wire bonds, or by flip chip interconnects, or by tab interconnects.

A number of approaches have been proposed for increasing the density of active semiconductor circuitry in integrated circuit chip packages, while minimizing package size (package footprint, package thickness). In one approach to making a high density package having a smaller footprint, two or more semiconductor die, of the same or different functionality, are stacked one over another and mounted on a package substrate.

Wire bond interconnect requires both vertical clearance over the die surface at the front side margin, to accommodate the wire loop height, and horizontal clearance outside the die footprint, to accommodate the wire span. If the vertical clearance is insufficient, overlying features may interfere with or introduce electrical shorting to the wire loops. And, in practice, the lower interconnect pad or bond site must be located some distance away from the sidewall of the overlying die, so that the wire bonding tool does not impact the die edge during the bonding process, and so that the wire bond does not contact the front edge of the die.

Electrical interconnection of stacked semiconductor die presents a number of challenges. For instance, two or more die in a stack may be mounted on a substrate with their front sides facing away from the substrate, and connected by wire bonds die-to-substrate or die-to-die. Die-to-die wire bond interconnect may be made where an upper die is dimensioned or located so that the upper die does not overlie the margin of the lower die to which it is connected, and so that sufficient horizontal clearance is provided for the wire span. This condition may pertain, for example, where the footprint of the upper die is sufficiently narrower than the lower die; or, for example, where the upper die is arranged so that the footprint of the upper die is offset in relation to the margin of the lower die. Alternatively, the die in the stack may be indirectly interconnected by connecting them to a common substrate on which the stack is mounted. Where a lower die in a stack is wire bonded die-to-substrate, and where the footprint of an upper die overlies the margin of the lower die, a spacer may be interposed to provide sufficient vertical clearance between the lower and the upper die to accommodate the wire loops over the lower die. The spacer adds to the thickness of the stack and, consequently, of the package. Moreover, in such a configuration the wire bond die-to-substrate connection of the lower die must be completed before the spacer and the upper die are stacked over it; that is, the die must be stacked in situ on the substrate and the die must be stacked and connected serially.

Die pads in processed semiconductor wafers as provided, or in singulated die, may not be arranged along one die edge, or along two adjacent die edges. The pads may be arranged in one or two rows near a centerline of the die, for example; or, if arranged along die edges, they may be arranged along two opposite die edges or along all four die edges, for example. Or, whatever the arrangement of pads on the wafer or on the die as provided, they may not be arranged in a suitable manner for a given end use; they may be located in an unsuitable sequence, or at an unsuitable pitch, for example). In such instances, the wafer or die as provided may if desired be further processed to reroute the original pads to new pad positions along one die edge or along two die edges, prior to mounting the die in stacks for interconnection according to the invention.

Also typically, a wafer as provided, or a singulated die, may optionally have a dielectric layer (such as glass, silicon nitride, polyimide, or a benzcyclobutene (BCB) polymer, for example) formed over the integrated circuitry except over the original die pads. This may suffice to provide electrical insulation of circuitry in the active side of the die from electrical conductors (including, for example, a first layer of rerouting circuitry) that may be formed over the front side of the die or wafer. Optionally a dielectric layer (such as glass, silicon nitride, polyimide, or a benzcyclobutene (BCB) polymer, for example) may additionally be formed over the rerouting circuitry except over the new (rerouted) interconnect pads. In such instances additional insulation between the front side of a die and the back side of a die stacked over it may be unnecessary.

SUMMARY

The invention features methods employing additive processes for electrically insulating selected surface regions on a stack of die, and methods for electrically interconnecting die in a stack of die, including additive processes for electrically insulating selected surface regions of the die. Regions that are not electrically insulated according to the invention are available for electrical connection using electrically conductive material applied in flowable form to make electrically conductive traces.

In a subtractive process for electrically insulating a die or a stack of die, as outlined below, the front side (at least) of the die is covered by an electrically insulative coating, and interconnect pads on the die are made available for electrical connection by selectively removing the electrically insulative coating over the pads. When the interconnect material is deposited over the die in the stack, the material contacts only the exposed pads, and no electrical contact is made with pads (or with other die surfaces overlain by the interconnect material) that remain covered by the electrically insulative coating.

An additive process for electrically insulating selected surface regions of a die or a stack of die may provide significant advantages by way of simplifying processing and reducing materials costs and capital outlay. For instance, in a subtractive process, the insulative material is typically applied over a wide area; in an additive process, the insulative material can be applied only over areas where electrical insulation is specifically desired, and the additive process can require use of significantly less of the insulative material. Also, for instance, in a subtractive process, additional process steps are required to selectively remove the insulative material where required; in an additive process, the selective deposition of application of insulative material requires no removal step, and the deposition or application may be entirely automated, as appropriate. Also, for instance, the machinery (such as laser apparatus, for ablation of material to be removed, for example) that is required for selective removal of insulative material in a subtractive process may not otherwise be employed on the assembly line; such equipment can require significant capital outlay and may demand additional resources for maintenance. Also, for instance, the use of various techniques for selective removal of insulative material must be carefully tuned and monitored according both to the particular material being removed and to the various underlying materials, so that the removal process does not result in damage to any of the various underlying structures.

In one general aspect the invention features a method for electrically insulating a selected interconnect die pad by applying a dielectric material onto the interconnect pad surface.

In another general aspect the invention features a method for electrically insulating at least a selected region of an interconnect die sidewall by applying a dielectric material onto the selected region of the die sidewall surface.

In another general aspect the invention features a method for electrically insulating at least a selected region of the front side of a die by applying a dielectric material onto the selected region of the front side of the die.

In some embodiments applying the dielectric material includes directing an aerosolized electrically insulative material onto the region of the die sidewall. The material may be a curable material, and the method further includes curing the material.

In another general aspect the invention features a method for forming a stacked die assembly, by providing semiconductor die having electrical interconnect pads arranged in an interconnect margin adjacent an interconnect die edge; stacking a plurality of said die in an offset configuration in which successive die in the stack are offset at the interconnect die edge and in which pads in successive die in the stack are arranged in columns; electrically insulating selected pads at which electrical connection is not desired; and forming electrically conductive traces over the columns. Exposed pads (not electrically insulated) are contacted by the electrically conductive traces and, where a plurality of pads in a column are exposed, the exposed pads are electrically interconnected by the electrically conductive trace; insulated pads are not available for contact by the electrically conductive traces and, accordingly, insulated pads are not electrically connected to other pads in the column.

In some embodiments the method further includes electrically insulating at least a selected region of an interconnect sidewall of at least one of the die in the stack. In some embodiments the method further includes electrically insulating at least a selected region of the front side of at least one of the die in the stack; in some such embodiments the selected region includes an area of the front side of the die inboard of the die pads, and in some such embodiments the area includes rerouting circuitry; in some such embodiments the selected region includes an area of the front side of the die adjacent an interconnect edge, and may in some such embodiments include an area of the interconnect margin; in some such embodiments the selected region includes an area between die pads, for example adjacent die pads, in a row of die pads on a die.

The selectively applied insulation may be characterized by having a surface that is not "wettable" by the particular interconnect material that is to be applied over it, or that is wettable, if at all, to a limited extent, so that the subsequently applied interconnect material has a reduced tendency to "run out" or to "bleed" over the surface. Selection of materials having these properties can aid in formation of narrower interconnects, and of interconnects having narrower pitch, without risk of electrical short between adjacent interconnects or between an interconnect and a surface to which electrical connection is not desired.

In various embodiments, electrical insulation is provided according to the invention over areas where insulation is required (or is desirable), without a need to remove insulation from any areas where insulation is not required (and is not desirable).

The assemblies according to the invention can be used in computers, telecommunications equipment, and consumer and industrial electronics devices.

BRIEF DESCRIPTION OF THE DRAWINGS

FIG. 10A is a diagrammatic sketch in a partial plan view showing the offset edges of an 8-die offset stack, interconnected according to an embodiment of the invention.

FIG. 11 is a diagrammatic sketch in a sectional view showing a portion of an aerosol application tool suitable for use in selectively applying an electrical insulation material according to an embodiment of the invention.

FIGS. 12A and 12B are diagrammatic sketches in plan view showing stages in deposition of an electrical insulation material according to an embodiment of the invention.

FIGS. 12D and 12E are diagrammatic sketches in plan view showing stages in deposition of an electrical insulation material according to another embodiment of the invention.

FIG. 12C is a diagrammatic sketch in a transverse sectional view of a deposited electrical insulation, taken at C-C' in FIG. 12B.

FIGS. 13A-13C are diagrammatic sketches showing a stage in depositing electrical insulation material onto selected pads on a stack of die according to an embodiment of the invention. FIG. 13A is a transverse partial sectional view; FIG. 13B is a partial elevational view; and FIG. 13C is a partial plan view.

FIGS. 14A-14C are diagrammatic sketches showing a stage in depositing electrical insulation material onto interconnect die sidewalls on a stack of die according to an embodiment of the invention. FIG. 14A is a transverse partial sectional view; FIG. 14B is a partial elevational view; and FIG. 14C is a partial plan view.

FIGS. 15A-15C are diagrammatic sketches showing a stage in depositing electrical insulation material onto selected pads on a stack of die according to another embodiment of the invention. FIG. 15A is a transverse partial sectional view; FIG. 15B is a partial elevational view; and FIG. 15C is a partial plan view.

FIGS. 16A-16C are diagrammatic sketches showing a stage in depositing electrical insulation material onto interconnect die sidewalls on a stack of die according to another embodiment of the invention. FIG. 16A is a transverse partial sectional view; FIG. 16B is a partial elevational view; and FIG. 16C is a partial plan view.

FIG. 18A is a transverse partial sectional view; and FIG. 18B is a partial plan view.

FIG. 19A is a transverse partial sectional view; and FIG. 19B is a partial plan view.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs. Also for clarity of presentation certain features are not shown in the FIGs., where not necessary for an understanding of the invention.

Subtractive Electrical Insulation Procedure

S. J. S. McElrea et al. U.S. patent application Ser. No. 12/124,077, filed May 20, 2008, titled "Electrically interconnected stacked die assemblies", which is incorporated herein by reference, describes among other things stacked die assemblies in which successive die in the stack are offset at a die edge at which die pads are situated, and the die are interconnected by electrically conductive traces. The electrically conductive traces may be formed of a material that is applied in a flowable form and subsequently cured or allowed to cure. Examples of such materials include electrically conductive polymers such as filled polymers, for example filled epoxies or electrically conductive inks. An electrically insulative conformal coating is provided having openings at die pads that are electrically connected. The electrically insulative coating prevents the electrically conductive material from making electrical contact with surfaces at which electrical continuity is not desired. Some examples of such constructs are illustrated in FIGS. 1A, 1B, 2A, 2B, 3A, 3B, 4A, 4B herein.

Figure 1A:
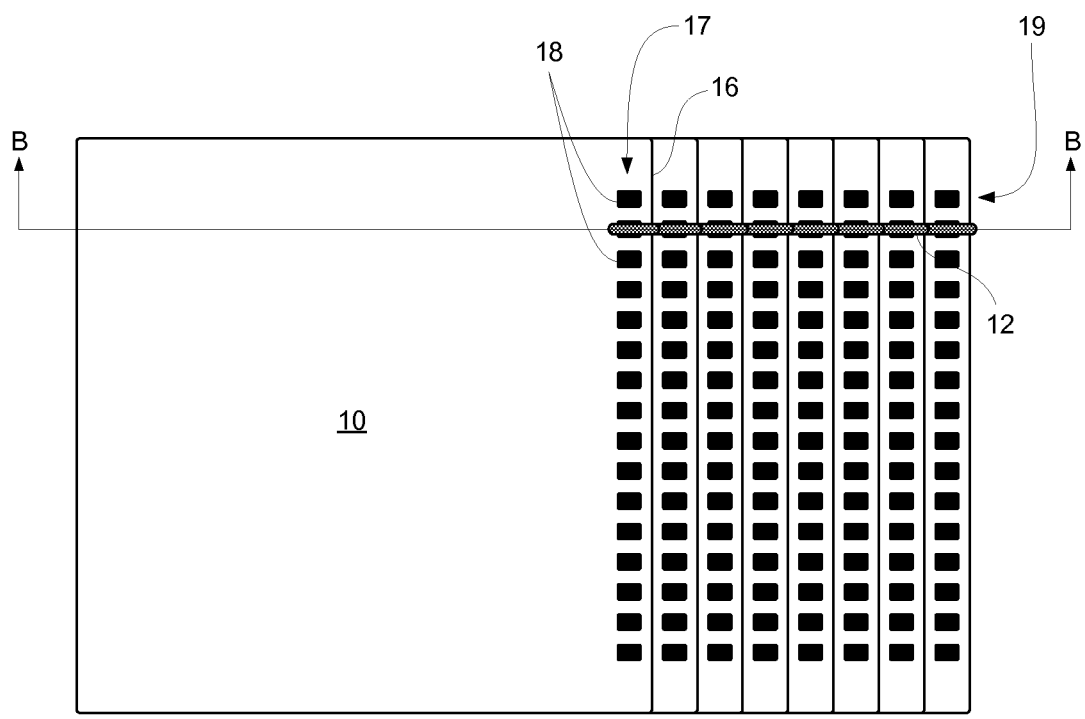
FIG. 1A is a diagrammatic sketch in a plan view showing interconnection of pads in a stack of die in an offset configuration.
Figure 1B:
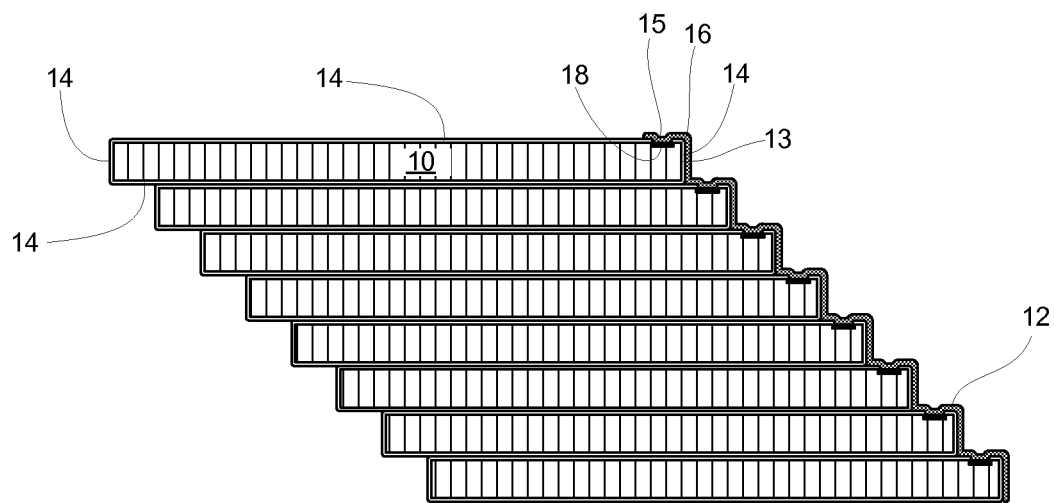
FIG. 1B is a diagrammatic sketch showing interconnected stacked die in a sectional view as indicated at B-B in FIG. 1A.

FIG. 1A shows in a plan view an arrangement of stacked offset die, each die having interconnect terminals arranged in one margin adjacent a front die edge; and FIG. 1B shows the stack in a sectional view as indicated at B-B in FIG. 1A. Referring to the uppermost die 10 in the stack, for example, interconnect die pads (e.g., pads 18) are in this example situated in a row 17 alongside front die edge 16. The die margin in which the row 17 of pads is situated may be referred to as an "interconnect margin", and the adjacent die edge 16 may be referred to as an "interconnectedge"; and the adjacent die sidewall 13 may be referred to as an "interconnect sidewall". In this example corresponding interconnect pads on successive die are aligned in columns, as indicated for example at 19 in FIG. 1A; accordingly, the sectional view in FIG. 1B passes through one such column. The offset die stack presents as a stair shape, and by analogy the interconnect margins constitute the stair treads and the interconnect sidewalls constitute the stair risers. Each die in this example (e.g., die 10) is covered on all surfaces (back surface, front surface, sidewalls) by a conformal coating 14, provided with openings exposing interconnect pads 18. Successive coated die in the stack may, as in these examples, rest directly one upon another, such that the coating on the back side of an upper die can contact the coating on the front side of the underlying die. Optionally, or additionally, a die attach film may be laminated onto the back side of one or more of the die.

Interconnect pads on successive die in the stack are electrically interconnected by traces (e.g., trace 12) of an electrically conductive interconnect material. The interconnect material is a material that can be applied in a flowable form, and thereafter cured or allowed to cure to form the conductive traces. To form the traces, the stack of die may be supported, for example, at the back side of the lowest of the die in the stack, and the interconnect material may be applied along a trajectory over the pads to be connected and the die surfaces between them. The interconnect material may be applied using an application tool such as, for example, a syringe or a nozzle. The material exits the tool in a deposition direction generally toward the interconnect terminals, and the tool is moved over the die stack face in a work direction. The material is deposited while the tool is moved. The material may be extruded from the tool in a continuous flow, or, the material may exit the tool dropwise. The material may exit the tool as a jet of droplets, and is deposited as dots which coalesce upon or following contact with a stack face surface. The droplets may be very small, and may exit the tool as an aerosol spray.

The interconnect material may be an electrically conductive polymer, such as a polymer filled with particles of an electrically conductive material. The material may be a curable polymer, for example, such as electrically conductive epoxy (for example, as silver filled epoxy); and, the interconnect process may include forming traces of the uncured material in a prescribed pattern and thereafter curing the polymer to secure the electrical contacts with the terminals and to secure the mechanical integrity of the traces between them. Or, the interconnect material may be an electrically conductive ink.

Figure 2A:
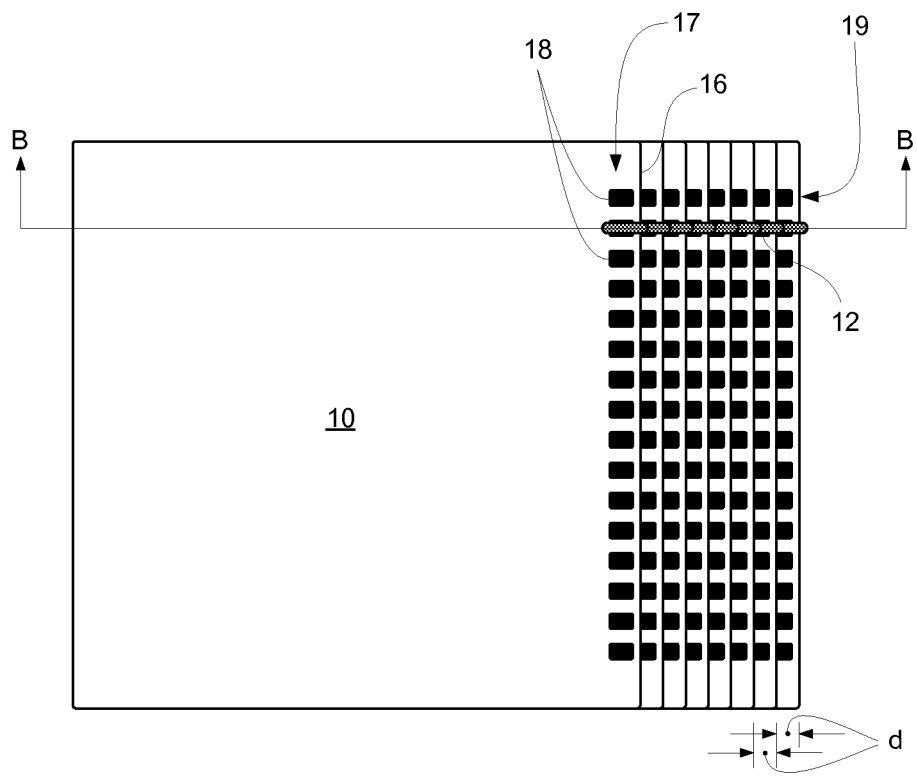
FIG. 2A is a diagrammatic sketch in a plan view showing interconnection of pads in a stack of die in another offset configuration.
Figure 2B:
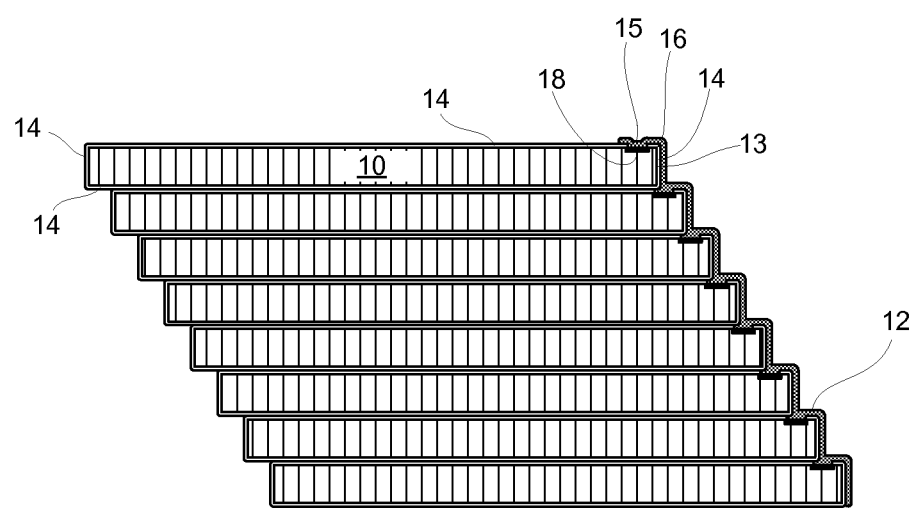
FIG. 2B is a diagrammatic sketch showing interconnected stacked die in a sectional view as indicated at B-B in FIG. 2A.

As FIGS. 1A and 1B show, the die stack has a greater footprint than a single die, as a result of the horizontal displacement of the die. It may be preferable to minimize the footprint of the stack, and this may be accomplished by reducing the extent of horizontal displacement of the die, as illustrated for example in FIGS. 2A, 2B. Each die need be displaced only to an extent at least sufficient to expose enough of the area of the pads in the underlying die to permit the interconnect material to make good electrical contact with the pads and, accordingly, the extent of displacement, indicated for example at d in FIG. 2A, is shown greater than may be necessary. In principle, the displacement may be sufficient if at least a fraction of the area of the pads is left uncovered by the overlying die. In practice, if the uncovered area of a pad is too small, the interconnect material as deposited may not contact the pad over an area great enough to establish a good electrical connection when the material is cured. It may be preferred to minimize the extent of displacement, so as to minimize the footprint of the stack.

FIGS. 1A, 1B, 2A, 2B show the die stack following deposition of interconnect material for a single trace. The procedure is repeated to deposit traces connecting all the pads for which electrical interconnection is desired, and following deposition the material is cured. Optionally, a cure or partial cure of the interconnect material may be carried out prior to completion of a trace, or prior to completion of all the traces.

As noted above, where the front side of the die is covered by an electrically insulative coating, pads on the die are made available for electrical connection by selectively removing the electrically insulative coating over the pads. When the interconnect material is deposited over the die in the stack, the material contacts only the exposed pads, and no electrical contact is made with pads (or with other die surfaces overlain by the interconnect material) that remain covered by the electrically insulative coating. In FIGS. 1A, 2A all the pads on all the die are shown as being exposed for electrical connection by the conductive traces and, accordingly, each of the pads in each die is in these examples electrically connected to pads on the other die in the stack. Depending upon the pad layout design on the die, it may not be desired to make electrical connection of all the pads on a given die with pads on other die or with circuitry in an underlying support. In such circumstances, the electrically insulative coating over selected ones of the pads on each die may be removed to expose the selected pads, and the coating may be left in place on pads to which electrical connection is not desired.

Figure 3A:
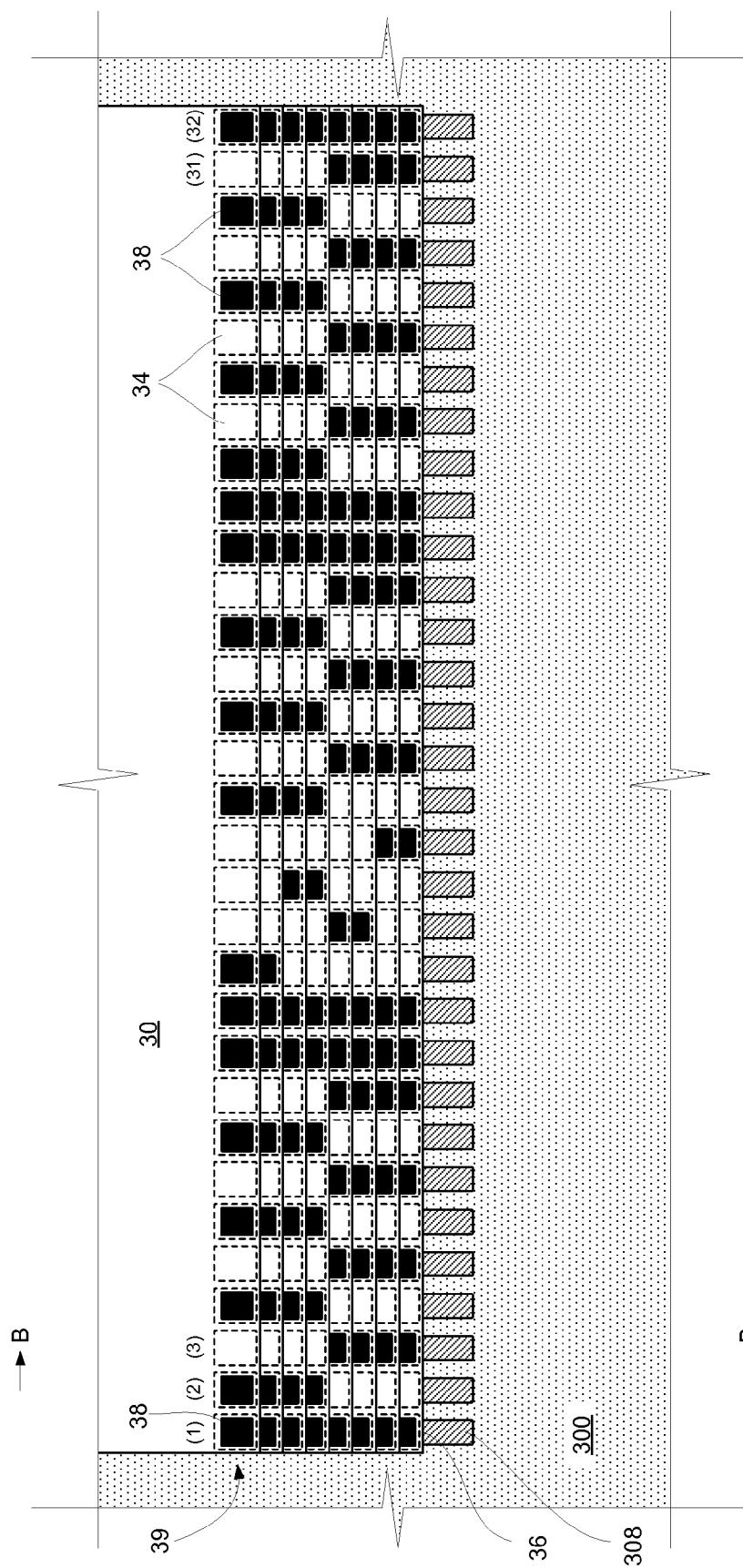
FIG. 3A is a diagrammatic sketch in a partial plan view showing the offset edges of an example of an 8-die offset stack.
Figure 3B:
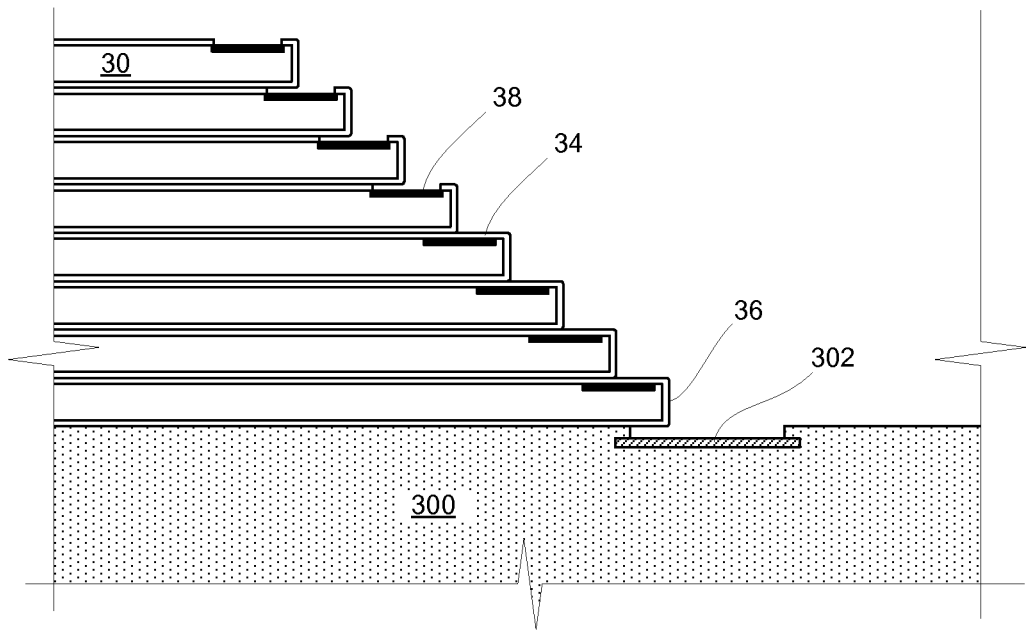
FIG. 3B is a diagrammatic sketch in a partial sectional view of an 8-die offset stack, as indicated at B-B in FIG. 3A.

This is illustrated with reference to FIGS. 3A, 3B, 4A, 4B. FIG. 3A shows by way of example a portion near the interconnectedge of an 8-die offset stack. Each die has a row 39 of pads (e.g., pads 38; 32 pads in this example). The pads may be referenced by numbers 1 through n (1-32 in this example) according to the pad locations, as suggested by the numerals in parentheses (1), (2), (3) . . . (31), (32) aligned with the pad positions on die 30 in FIG. 3A. The die are stacked one over another and offset so that the interconnectedge of each die (except the lowermost die) is set back with respect to the interconnectedge of the die underlying it. The die are arranged in the stack so that corresponding pad locations are aligned in columns. The stack is mounted on a support (here a substrate) 300 having interconnect sites (leads) 308. The lowermost die in the stack is oriented with the substrate so that the stack edge (lower die interconnectedge 36) overlaps the leads on the substrate, and so that the pad columns are aligned with the leads, so there is no interconnect span dimension next to the stack. The die in this example are each covered on all sides with a conformal insulative coating (of a material such as for example a parylene). Openings through the conformal coating were made in each die to expose selected interconnect die pads (pads 38, for example), while leaving selected other interconnect die pads protected (insulated), as at 34, for example. FIG. 3B is a sectional view thru the construct of FIG. 3A at the pad location (2) column, as indicated at B-B in FIG. 3A. In this column, the pads in the upper four die (e.g., pad 38 in the fourth die) are exposed by openings in the conformal insulative coating, and the pads in the lower four die (e.g., as indicated at 34 in the fifth die) are left covered.

Figure 4B:
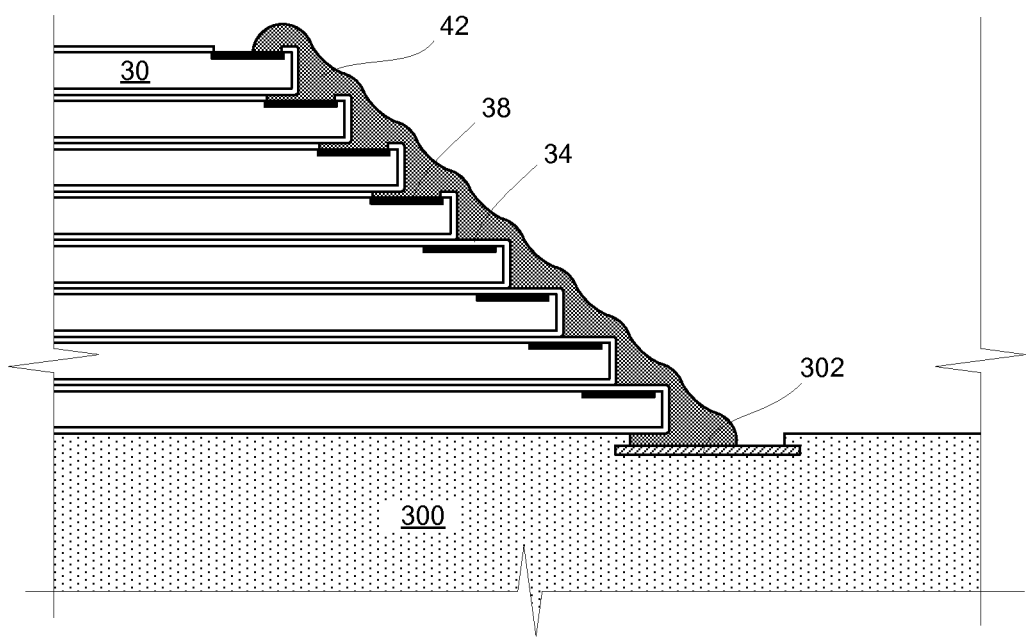
FIG. 4B is a diagrammatic sketch in a partial sectional view of an 8-die offset stack, as indicated at B-B in FIG. 4A, interconnected.
Figure 4A:
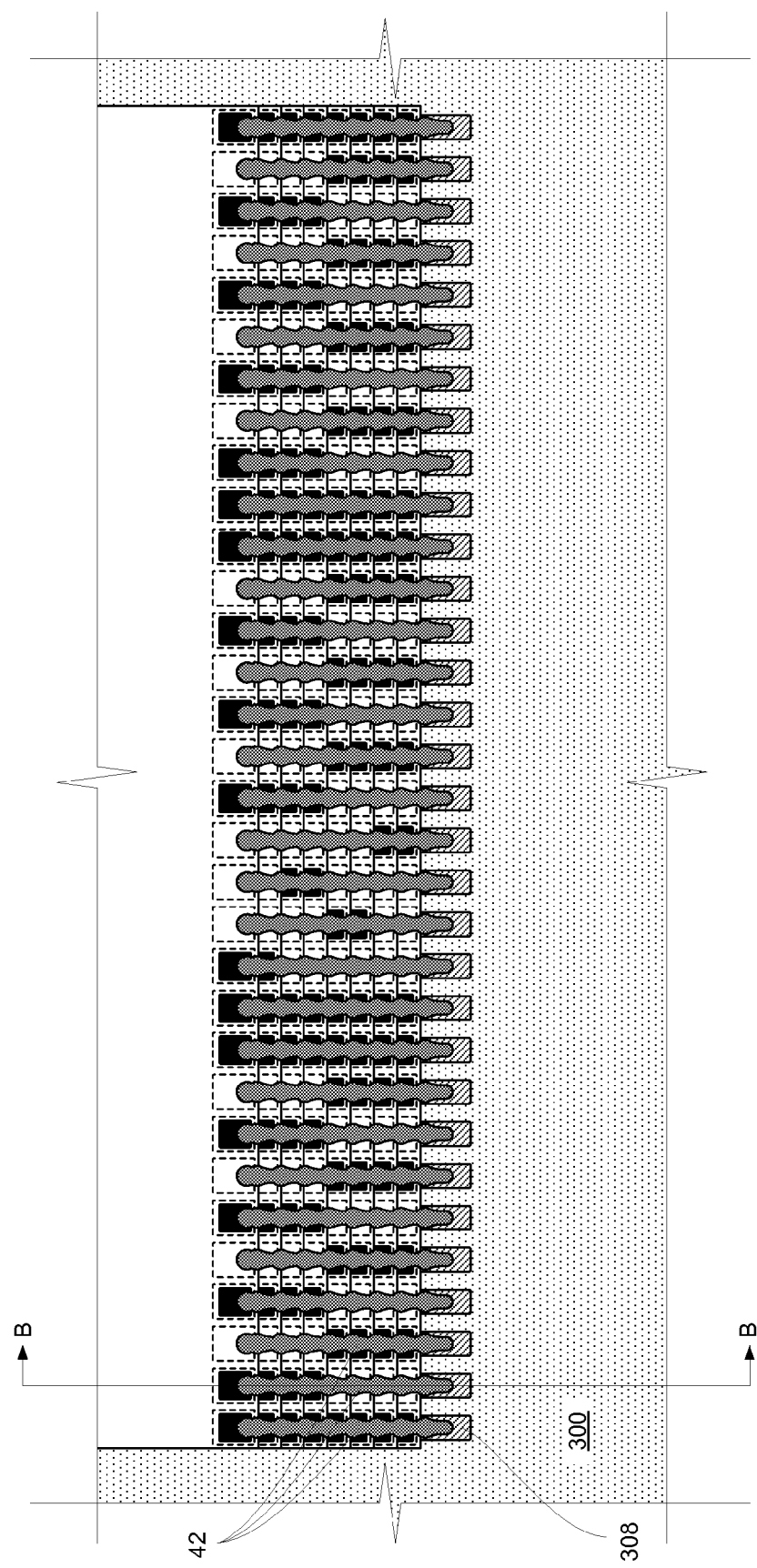
FIG. 4A is a diagrammatic sketch in a partial plan view showing the offset edges of an example of an 8-die offset stack, interconnected.

FIGS. 4A, 4B show the interconnect portion of an 8-die offset stack, as in FIGS. 3A, 3B, electrically interconnected with interconnect traces formed over the pad columns (e.g., traces 42 over columns (1), (2), (3)). FIG. 4B is a sectional view thru the construct of FIG. 4A at the pad location (2) column, as indicated at B-B in FIG. 4A. The traces electrically connect exposed die pads in the column (e.g., pad 38) to other exposed die pads in the column and to a corresponding interconnect site 302 on the substrate 300. Pads that remain covered by the insulative coating (e.g., as indicated at 34), and other die surfaces overlain by the interconnect material are not electrically connected.

The procedure outlined above for die insulation and selection of pads to be electrically connected may be referred to a "subtractive process", inasmuch as a dielectric coating is formed over all the pads, and pads to be electrically connected are exposed by selective removal of the coating over those pads.

Additive Insulation Procedure

Die insulation according to various embodiments described in this application may be referred to as an "additive process". Here, a dielectric material is applied to areas of the die surface where electrical contact with the conductive interconnect traces is not desired, such as die pads that are not to be electrically connected, leaving uncovered the die pads that are to be electrically connected. The dielectric material prevents the subsequently applied electrically conductive material from making electrical contact with surfaces at which electrical continuity is not desired. No step of selectively removing dielectric coating is required.

Figure 5A:
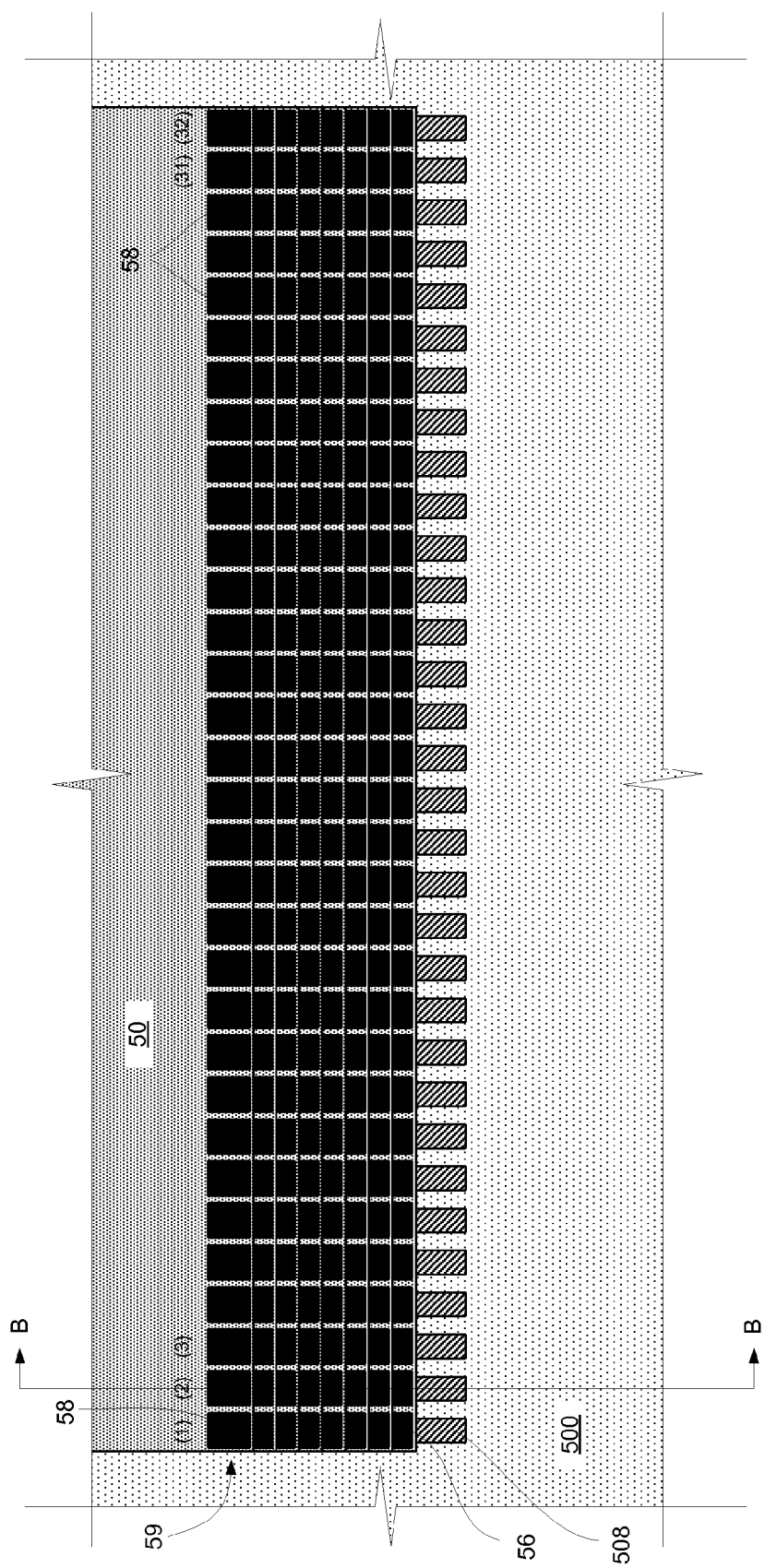
FIG. 5A is a diagrammatic sketch in a partial plan view showing the offset edges of an 8-die offset stack in an embodiment of the invention.
Figure 5B:
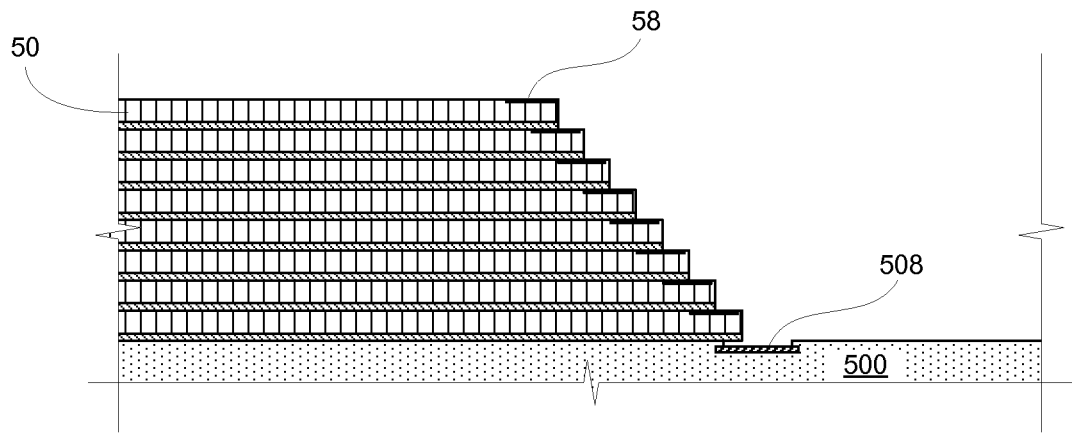
FIG. 5B is a diagrammatic sketch in a partial sectional view of an 8-die offset stack in an embodiment of the invention, as indicated at B-B in FIG. 5A.

FIG. 5A shows in plan view a portion near the interconnectedge of an 8-die offset stack. Each die has a row 59 of pads (e.g., pads 58; 32 pads in this example). The pads may be referenced by numbers 1 through n (1-32 in this example) according to the pad locations, as suggested by the numerals in parentheses (1), (2), (3) . . . (31), (32) aligned with the pad positions on die 50 in FIG. 5A. The die are stacked one over another and offset so that the interconnect edge of each die above the lowermost die is set back with respect to the interconnectedge of the die underlying it. The die are arranged in the stack so that corresponding pad locations are aligned in columns. The stack is mounted on a support (here a substrate) 500 having interconnect sites (leads) 508. The lowermost die in the stack is oriented with the substrate so that the stack edge (lower die interconnectedge 56) overlaps the leads on the substrate, and so that the pad columns are aligned with the leads, so there is no interconnect span dimension next to the stack. FIG. 5B shows the structure of FIG. 5A in a sectional view thru a column (the pad location (2) column in this example).

Figure 6B:
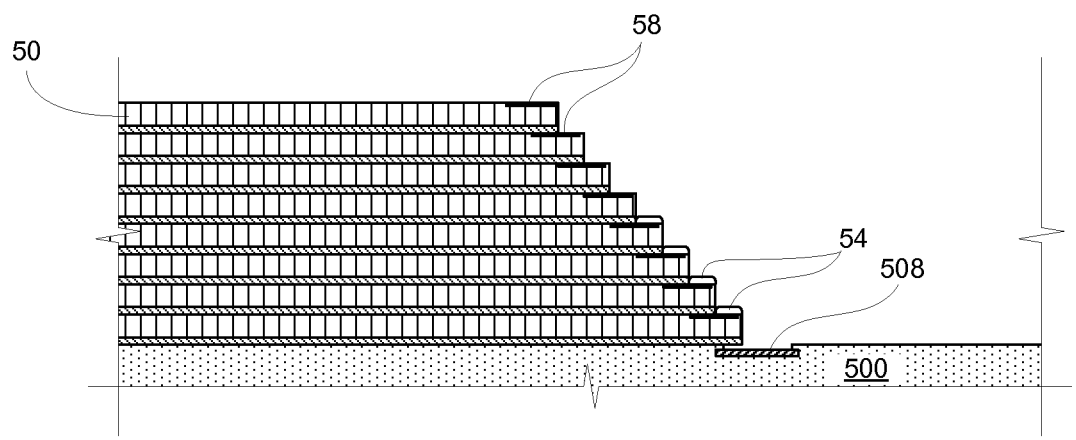
FIG. 6B is a diagrammatic sketch in a partial sectional view of an 8-die offset stack, as indicated at B-B in FIG. 6A, having selected die pads insulated according to an embodiment of the invention.
Figure 6A:
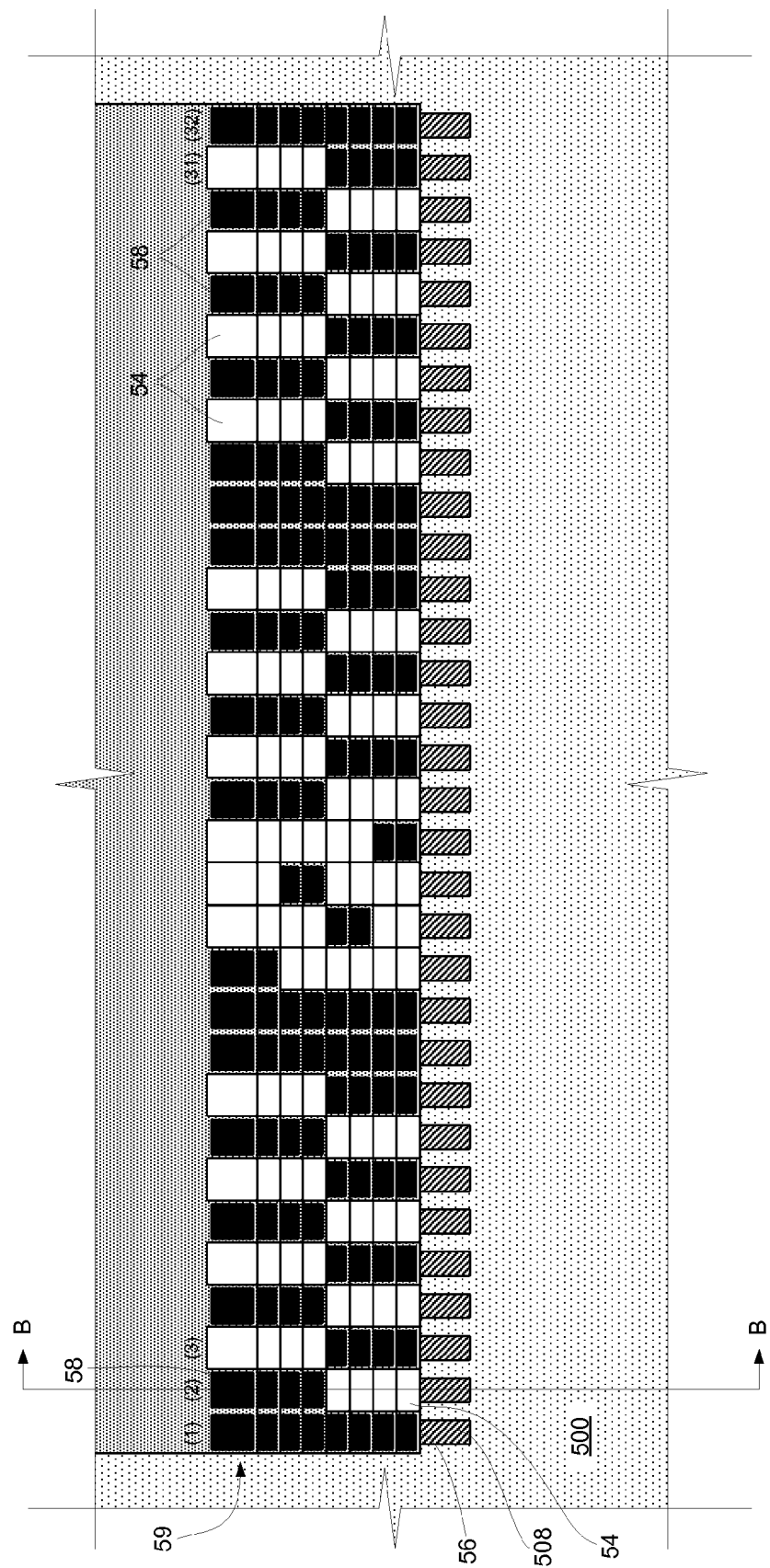
FIG. 6A is a diagrammatic sketch in a partial plan view showing the offset edges of an 8-die offset stack, having selected die pads insulated according to an embodiment of the invention.

FIGS. 6A, 6B show a portion near the interconnectedge of an 8-die offset stack configured as in FIGS. 5A, 5B, in which selected die pads have been insulated according to an aspect of the invention. FIG. 6A is a plan view, and FIG. 6B is a sectional view thru the pad location (2) column. Particularly, with reference to the pad location (2) column in this example, a dielectric material has been selectively deposited (e.g., 54) on the location (2) pads on the lower four die in the stack, while the location (2) pads (e.g., pads 58) on the upper four die in the stack are left uncovered. And with reference to the pad location (3) column in this example, a dielectric material has been selectively deposited on the location (3) pads on the upper four die in the stack, while the location (3) pads on the lower four die in the stack are left uncovered. And with reference to the pad location (1) column in this example, no dielectric material has been selectively deposited on the location (1) pads, so that the location (1) pads on all eight die in the stack are left uncovered.

Figure 7B:
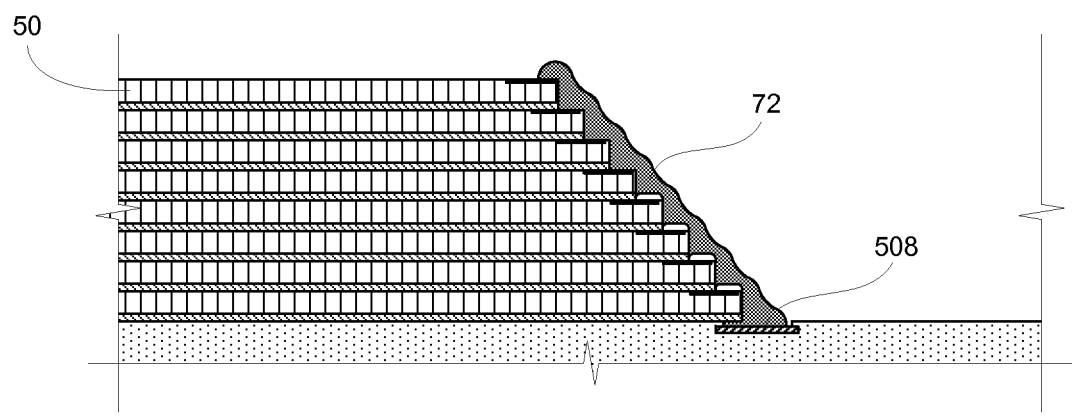
FIG. 7B is a diagrammatic sketch in a partial sectional view of an 8-die offset stack, as indicated at B-B in FIG. 7A, interconnected according to an embodiment of the invention.
Figure 7A:
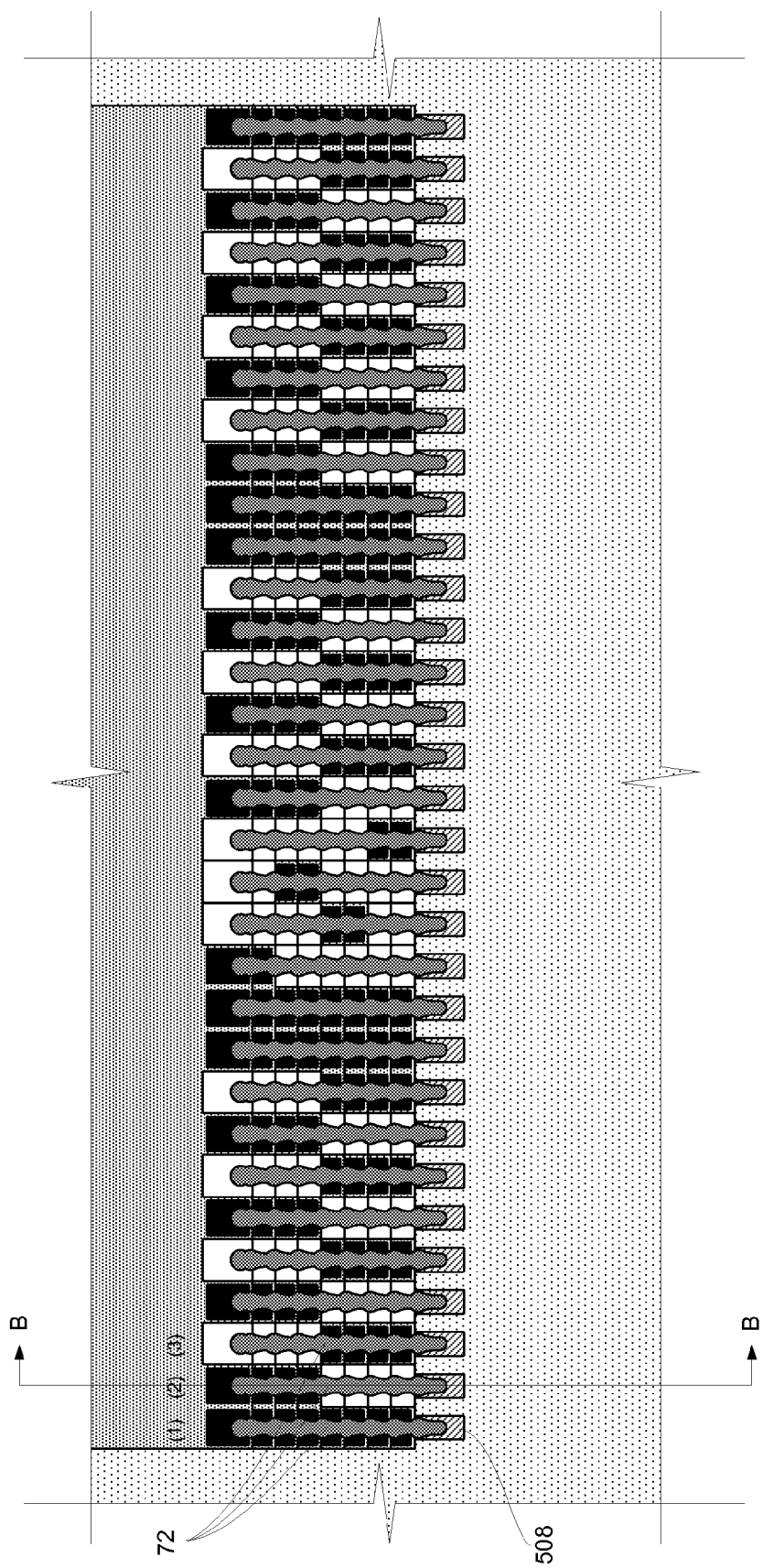
FIG. 7A is a diagrammatic sketch in a partial plan view showing the offset edges of an 8-die offset stack, interconnected according to an embodiment of the invention.

FIGS. 7A, 7B show a portion near the interconnectedge of an 8-die offset stack configured as in FIGS. 5A, 5B, and insulated according to an aspect of the invention as in FIGS. 6A, 6B, and electrically interconnected by conductive traces over the pad columns (e.g., conductive traces 72 over pad location columns (1), (2), (3)). FIG. 7A is a plan view, and FIG. 7B is a sectional view thru the pad location (2) column. Particularly, with reference to the pad location (2) column in this example, the electrically conductive trace 72 is formed over the various surfaces at the pad location column, and contacts the lead 508 at the substrate. The trace makes electrical contact with the position (2) pads on the upper four die, which were left uncovered; the trace makes no connection with the position (2) pads on the lower four die, which are covered by the dielectric material. Consequently, the position (2) pads (e.g., pads 58) on the upper four die in the stack are electrically interconnected to one another, and they are electrically connected to the corresponding lead 508 on the substrate, and the position (2) pads on the lower four die are not electrically connected to one another or to the substrate. With reference to the pad location (3) column in this example, the position (3) pads on the lower four die in the stack are electrically interconnected to one another and to the corresponding lead on the substrate, and the position (3) pads on the upper four die are not electrically connected to one another or to the substrate. And with reference to the pad location (1) column in this example, all the location (1) pads on all eight die in the stack are electrically connected to one another and to the corresponding lead on the substrate.

Figure 8A:
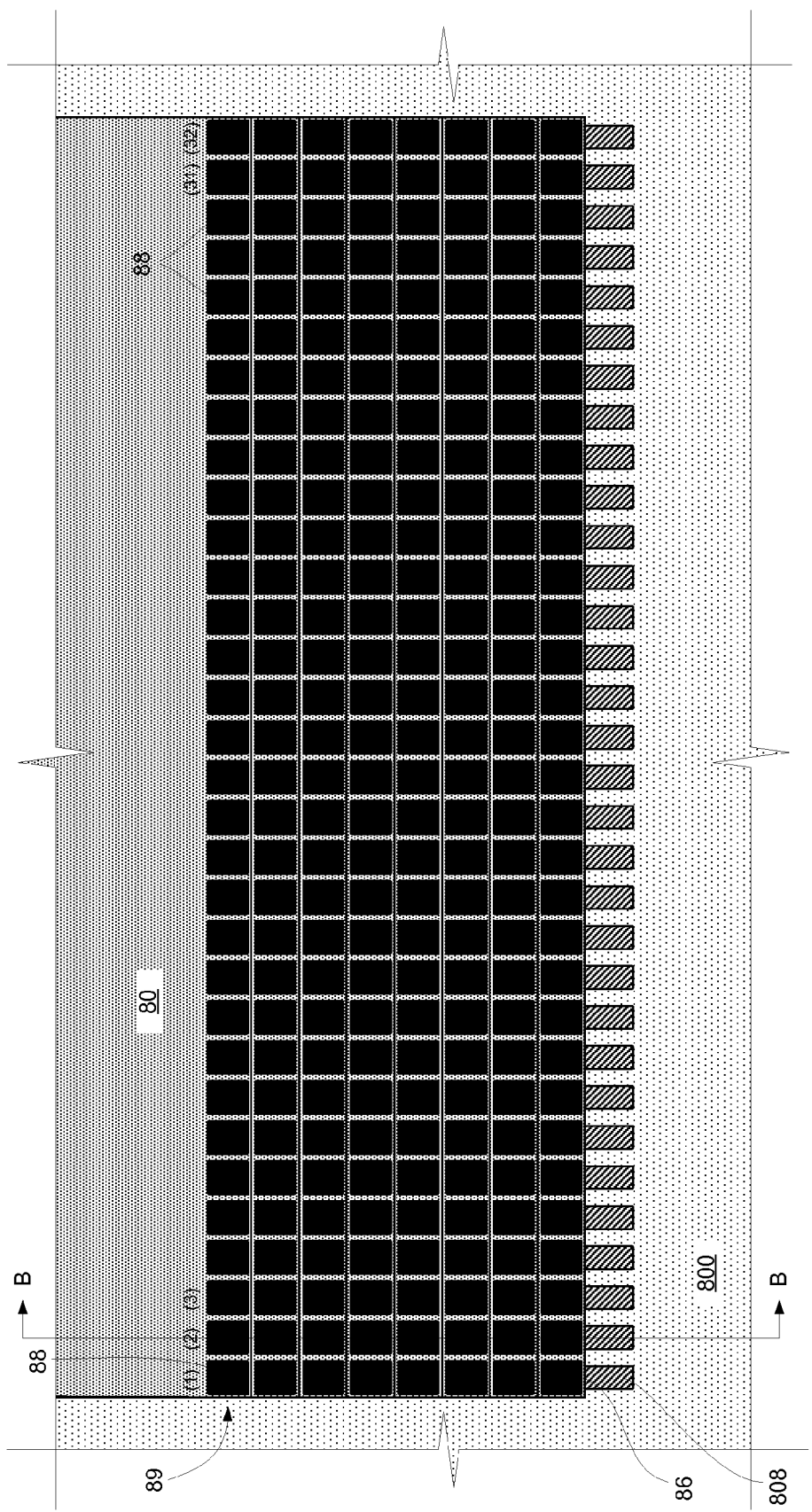
FIG. 8A is a diagrammatic sketch in a partial plan view showing the offset edges of an 8-die offset stack in another embodiment of the invention.
Figure 8B:
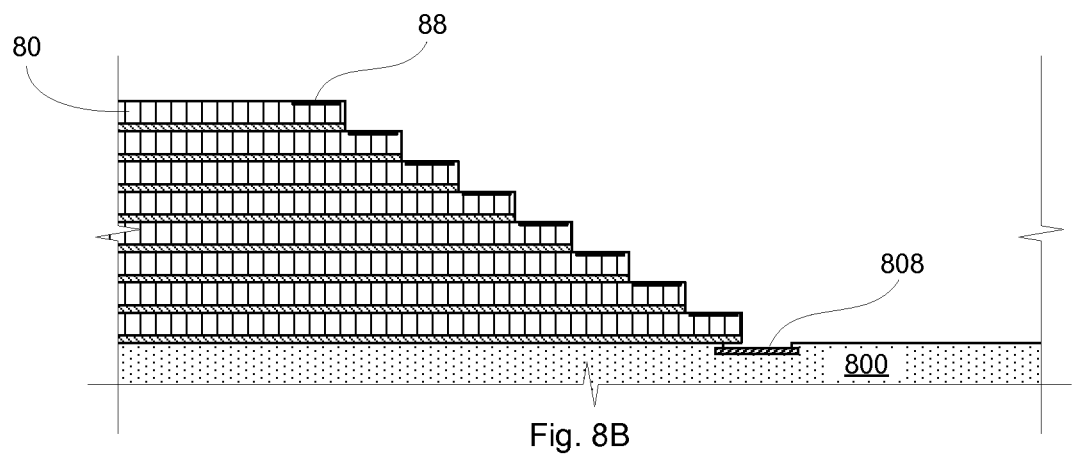
FIG. 8B is a diagrammatic sketch in a partial sectional view of an 8-die offset stack in an embodiment of the invention, as indicated at B-B in FIG. 8A.
Figure 9B:
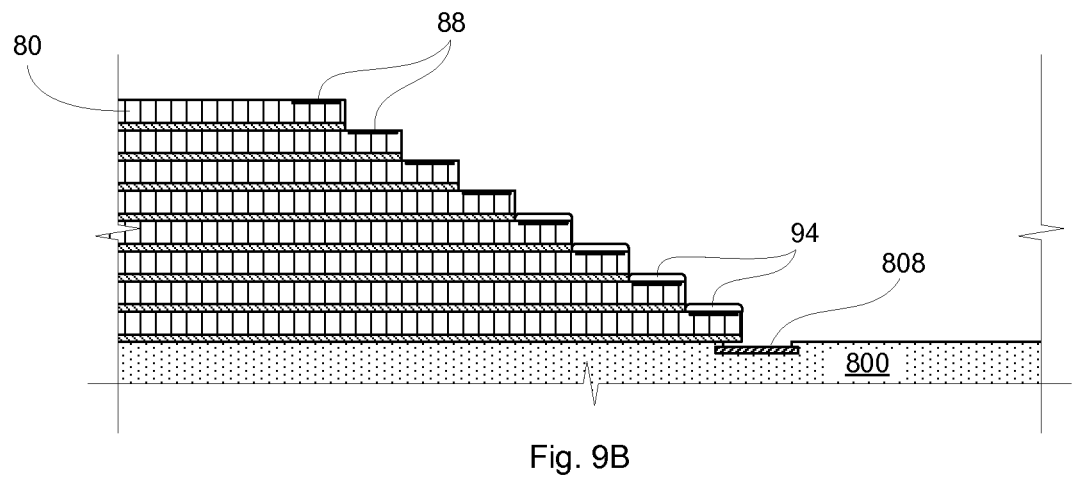
FIG. 9B is a diagrammatic sketch in a partial sectional view of an 8-die offset stack, as indicated at B-B in FIG. 9A, having selected die pads insulated according to an embodiment of the invention.
Figure 9A:
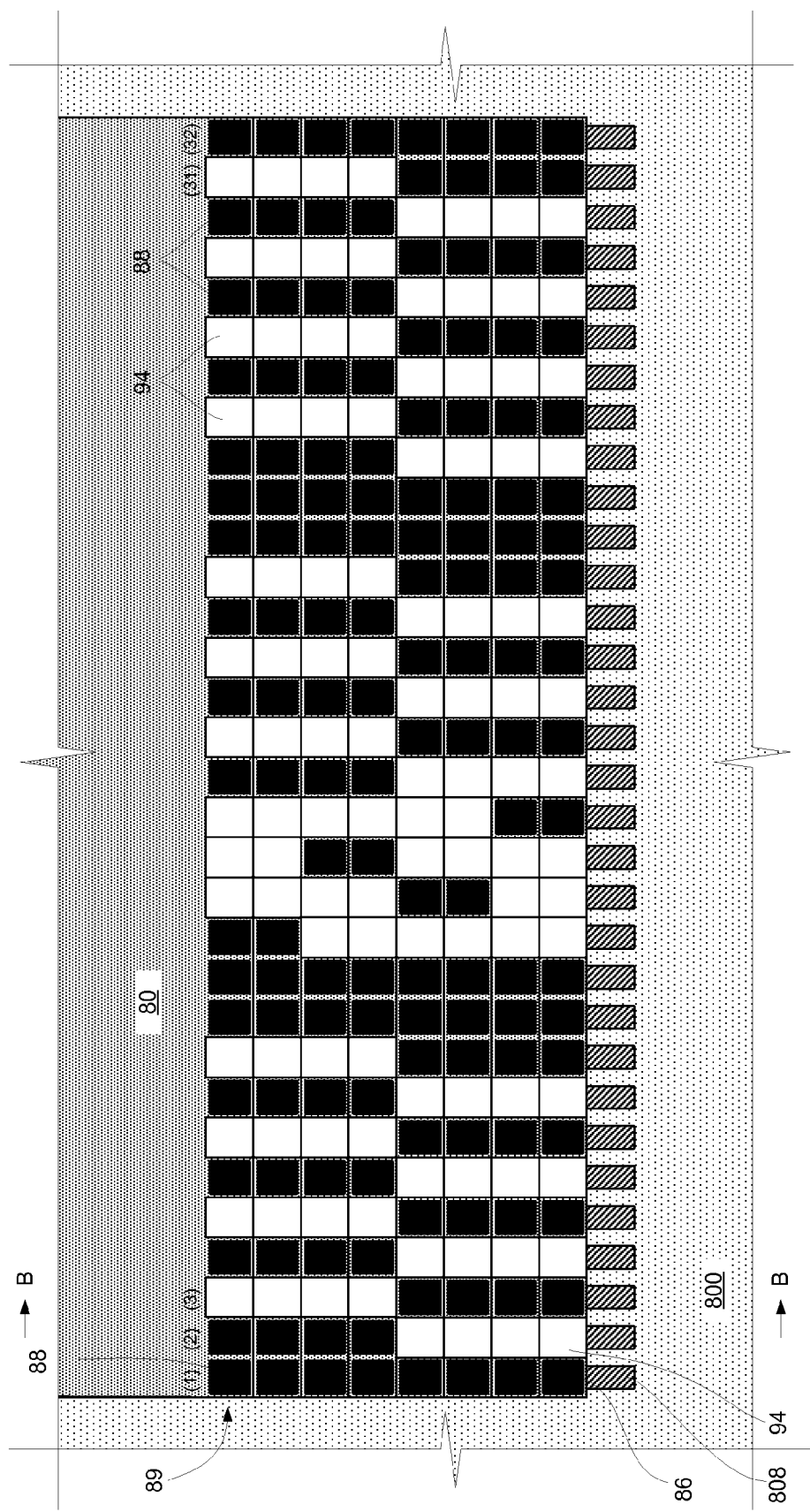
FIG. 9A is a diagrammatic sketch in a partial plan view showing the offset edges of an 8-die offset stack, having selected die pads insulated according to an embodiment of the invention.

FIGS. 8A-8B, 9A-9B, 10A-10B show stages in the construction of an electrically interconnected die assembly according to another embodiment of the invention. These FIGs. show a portion near the interconnectedge of an 8-die offset stack, generally as in FIGS. 5A-5B, 6A-6B, 7A-7B, and the structure is similar, except that the die offset is greater in these FIGs., so that the die pads on underlying die are fully revealed by the offset. Particularly, FIGS. 9A, 9B illustrate a stage following insulation of selected pads.

Figure 18A:
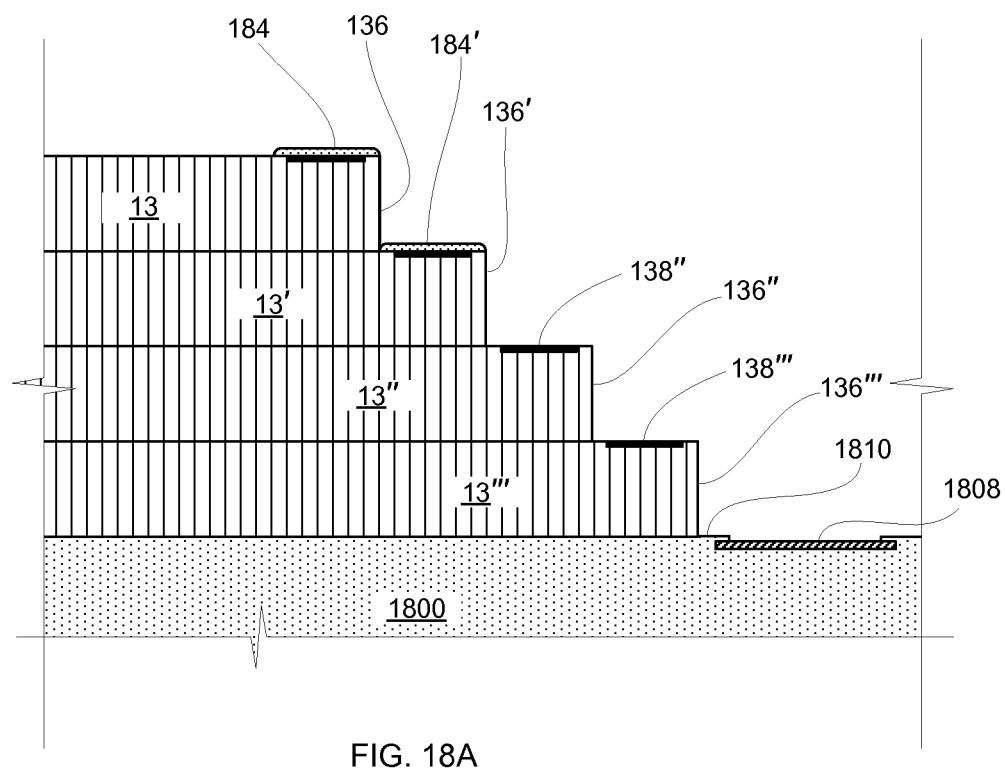
FIGS. 18A and 18B are diagrammatic sketches showing a stage in depositing electrical insulation material onto selected pads on a stack of die according to another embodiment of the invention.
Figure 18B:
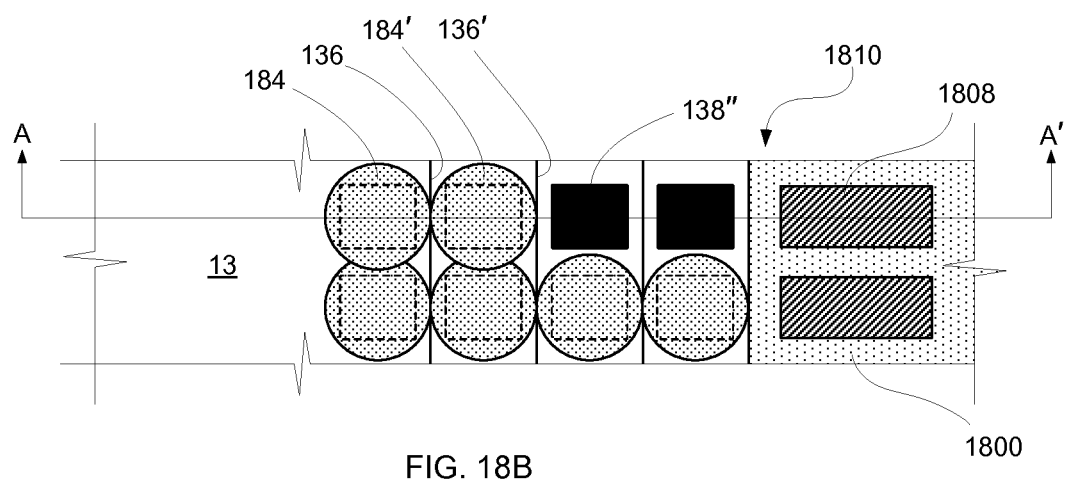

FIG. 8A shows in plan view a portion near the interconnectedge of an 8-die offset stack. Each die has a row 89 of pads (e.g., pads 88; 32 pads in this example). The pads may be referenced by numbers 1 through n (1-32 in this example) according to the pad locations, as suggested by the numerals in parentheses (1), (2), (3) . . . (31), (32) aligned with the pad positions on die 80 in FIG. 8A. The die are stacked one over another and offset so that the interconnect edge of each die above the lowermost die is set back with respect to the interconnectedge of the die underlying it; in this example the offset is great enough to entirely expose pads on underlying die. The die are arranged in the stack so that corresponding pad locations are aligned in columns. The stack is mounted on a support (here a substrate) 800 having interconnect sites (leads) 808. The lowermost die in the stack is oriented with the substrate so that the pad columns are aligned with the leads. In this example, the stack edge (lower die interconnectedge 86) overlaps the leads on the substrate, so that so there is no interconnect span dimension next to the stack. FIG. 8B shows the structure of FIG. 8A in a sectional view thru a column (the pad location (2) column in this example). In other embodiments (not shown) the lowermost die in the stack may be aligned so that the stack edge (lower die interconnectedge)

does not overlap the leads on the substrate; in particular, the lower die interconnectedge may be situated at an inboard edge of the leads (refer for example to FIGS. 19A, 19B), or the lower die interconnectedge may be set back (in an inboard direction) from the leads (refer for example to FIGS. 18A, 18B).

FIGS. 9A, 9B show a portion near the interconnectedge of an 8-die offset stack configured as in FIGS. 8A, 8B, in which selected die pads have been insulated according to an aspect of the invention. FIG. 9A is a plan view, and FIG. 9B is a sectional view thru the pad location (2) column. Particularly, with reference to the pad location (2) column in this example, a dielectric material has been selectively deposited (e.g., 94) on the location (2) pads on the lower four die in the stack, while the location (2) pads (e.g., pads 88) on the upper four die in the stack are left uncovered. And with reference to the pad location (3) column in this example, a dielectric material has been selectively deposited on the location (3) pads on the upper four die in the stack, while the location (3) pads on the lower four die in the stack are left uncovered. And with reference to the pad location (1) column in this example, no dielectric material has been selectively deposited on the location (1) pads, so that the location (1) pads on all eight die in the stack are left uncovered.

Figure 10B:
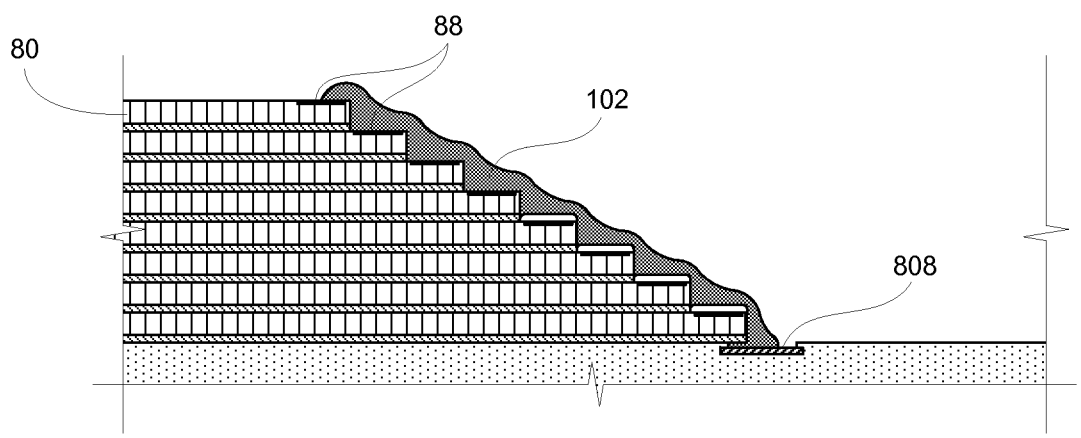
FIG. 10B is a diagrammatic sketch in a partial sectional view of an 8-die offset stack, as indicated at B-B in FIG. 10A, interconnected according to an embodiment of the invention.

FIGS. 10A, 10B show a portion near the interconnectedge of an 8-die offset stack configured as in FIGS. 8A, 8B, and insulated according to an aspect of the invention as in FIGS. 9A, 9B, and electrically interconnected by conductive traces over the pad columns (e.g., conductive traces 102 over pad location columns (1), (2), (3)). FIG. 10A is a plan view, and FIG. 10B is a sectional view thru the pad location (2) column. Particularly, with reference to the pad location (2) column in this example, the electrically conductive trace 102 is formed over the various surfaces at the pad location column, and contacts the lead 808 at the substrate. The trace makes electrical contact with the position (2) pads on the upper four die, which were left uncovered; the trace makes no connection with the position (2) pads on the lower four die, which are covered by the dielectric material. Consequently, the position (2) pads (e.g., pads 88) on the upper four die in the stack are electrically interconnected to one another, and they are electrically connected to the corresponding lead 808 on the substrate, and the position (2) pads on the lower four die are not electrically connected to one another or to the substrate. With reference to the pad location (3) column in this example, the position (3) pads on the lower four die in the stack are electrically interconnected to one another and to the corresponding lead on the substrate, and the position (3) pads on the upper four die are not electrically connected to one another or to the substrate. And with reference to the pad location (1) column in this example, all the location (1) pads on all eight die in the stack are electrically connected to one another and to the corresponding lead on the substrate.

The dielectric material may be applied using any of a variety of techniques. In some embodiments the dielectric material is applied in an aerosol. Usually, the dielectric material is applied by aerosol jet printing. In aerosol jet printing the material is aerosolized and then entrained in a carrier as an aerodynamically focused droplet stream that can be directed through a nozzle onto a target surface. Suitable aerosol jet apparatus may include, for example, the M3D system, available from Optomec, Inc., Albuquerque, N. Mex. FIG. 11 shows a nozzle of an example of suitable aerosol jet apparatus, in a diagrammatic sectional view thru the nozzle axis. The nozzle 118 has a lumen 124 defined by an inner surface 112 of a generally tubular wall 110. An aerosol jet head (not shown in the FIG.) forms a flow of a sheath gas 115 surrounding a flow of aerosolized material 113. The flow of sheath gas and the entrained aerosolized material emerge from the tip 116 of the nozzle along a flow axis 117. The profile (that is, the shape in transverse section) and dimensions of the jet of aerosolized material can be controlled by selecting the dimensions of the nozzle lumen and by controlling the flow at various points around the flow axis. The jet profile may be generally round, for example circular or roughly circular. The apparatus may be manipulated to direct the jet toward a target surface, and the target and the nozzle may be moved in relation to one another as indicated by the arrow 119 to form a line of material on the target surface.

FIGS. 12A-12C show a resulting line of material. In the example shown here, the profile of the jet has an elongated round shape, so that at any instant it would be expected to deposit the material in a corresponding shape as illustrated 122 in FIG. 12A. Movement of the nozzle tip over the target surface in a direction as illustrated by the arrow 129 in FIG. 12A forms a line 124, as shown in FIG. 12B, having a width w generally corresponding to the width of the jet profile. FIG. 12C shows a transverse sectional view of a deposited line of material 124 on a target surface 125, having a width w and a thickness t.

The profile of the jet may have a shape other than an elongated round shape. FIGS. 12D and 12E show a resulting line of material in an embodiment in which the jet has a generally circular shape, so that at any instant it would be expected to deposit the material in a corresponding shape as illustrated 126 in FIG. 12D. Movement of the nozzle tip over the target surface in a direction as illustrated by the arrow 129 in FIG. 12D forms a line 128, as shown in FIG. 12E, having a width w generally corresponding to the width (diameter) of the jet profile.

The dielectric material may be applied by any of a variety of techniques. The dielectric material may be applied by a jetting technique, employing for example piezoelectric jetting apparatus to deposit the material by droplets. Suitable piezoelectric "inkjet" apparatus is available from, for example, FUJIFILM Dimatix, Inc., Santa Clara, Calif.; other suitable piezoelectric jetting apparatus is available from, for example, Nordson Asymtek, Carlsbad, Calif. Or, the dielectric material may be applied by a streaming technique, employing pump-driven apparatus to deposit the material in a column. Suitable streaming apparatus is available from, for example, Speedline Technologies, under the trade name SmartStream®.

The width of the deposited line of material can be set, within limits of the particular equipment, with some precision. The width of the deposited line of material may in some embodiments range from about 10 um or less to about 100 um or greater; in some embodiments the width of the deposited line of material is within a range about 10 um to about 100 um, such as, in a particular example, about 50 um. As will be appreciated, a specified width of deposited material will be determined according to the dimensions of the surface (such as, for example, the width and length of the die pad, or the width of the interconnect trace to be formed subsequently, or the width of the interconnect margin, or the die stack setback, or the height of the die sidewall) to be insulated. As described in more detail below, where a width (for example) of a surface to be covered exceeds a practical limit for the width of a deposited line of material, the material may be deposited by two or more adjacent (or overlapping) lines.

The thickness of the deposited line of material can be established by setting the rate of movement of the nozzle tip over the target surface; a thicker line results from a slower movement. The line should be thick enough to sufficiently electrically insulate the surface, and this depends among other things upon the dielectric properties of the material itself, and upon the electrical parameters in operation of the die assembly. The thickness of the deposited line may in some embodiments range from as thin as about 1 nm or less to about 20 um or greater. In some embodiments the thickness is in a range about 7 um to about 13 um, such as about 10 um. It may be desirable not to form the lines with a thickness excessively greater than required, so that the general planarity of the surfaces is not overly disrupted.

The electrically insulative material is capable of being atomized, and typical such materials are applied onto the target surface in an aerosol and then cured to form an electrically insulative covering. Suitable electrically insulative materials include, for example, low viscosity dielectric materials, sometimes referred to as "dielectric inks". Examples include any of various inorganic dielectric materials, mixed in any of various curable organic carriers. Examples of suitable materials include titanate compounds (for example, barium titanate) as the inorganic dielectric material; and a curable organic polymer (such as a phenol resin, or an epoxy/melamine resin) as the organic carrier. Such materials may be obtained from, for example, NOF Corporation; or materials marketed under the name Loctite.

FIGS. 13A, 13B, 13C illustrate a stage in insulation of selected die pads by aerosol spray according to an embodiment of the invention. FIG. 13C is a partial plan view showing two pad columns in a stack of four die in an offset configuration; FIG. 13B is a partial elevational view taken toward the die sidewalls; and FIG. 13A is a partial sectional view at A-A' thru the die stack at a pad column. Each of die 13, 13', 13", 13''' in the stack has pads 138, 138', 138", 138''' arranged in an interconnect margin of the die. The nozzle 130 in this illustration is oriented so that the flow axis 117 of the dielectric material is generally perpendicular to the plane of the front side of the die and, in this illustration the nozzle is moved in a work direction 139 generally parallel to the plane of the front side of the die, and generally aligned with an underlying pad column. In this example the jet apparatus is controlled so that the material flows discontinuously; that is, the material flows during intervals when the flow axis is directed at a selected target region (in this example, selected die pads). As a result the regions of the surface at the respective pads are covered with discrete patches of dielectric material. At the stage illustrated, patch 134 has been completed, fully covering pad 138 on die 13; deposition of patch 134' is not yet complete, and a portion of pad 138' has not yet been fully covered.

As may be appreciated, the nozzle need not be oriented so that the flow axis is generally perpendicular to the plane of the front side of the die; and the work direction need not be generally parallel to the plane of the front side of the die. An example of an alternative flow axis orientation is suggested by arrow 117', and an example of an alternative work direction is suggested by arrow 139'; other arrangements are contemplated.

In a subsequent procedure, electrically conductive material will be applied in a flowable form and subsequently cured or allowed to cure to form the interconnect traces, as shown for example in FIGS. 10A, 10B. The electrically conductive material generally conforms to and contacts the surface onto which it is applied; the surface may include conductive features (such as die pads, for example) and semiconducting areas (such as a bare die surface, for example). Electric contact may or may not be made between the conductive trace and a conductive feature or semiconducting area over which the trace is formed, depending upon whether the feature or area has been insulated. As shown in FIGS. 9A, 9B, and 13A, 13B, 13C, die pads are selectively insulated according to embodiments of the invention by selectively applying a dielectric material onto certain of the pads where electrical connection is not desired, effectively preventing the interconnect material from contacting these selected pads.

Referring again to FIGS. 13A, 13B for illustration, the electrically conductive material additionally contacts areas of the die surface at the interconnect sidewalls 136, 136', 136", 136''', and of the portions of the interconnect margin adjacent the die pads at the interconnect die edge and inboard from the pads (e.g., the portions 135, 137 of the interconnect margin adjacent pad 138. Where these areas of the die as provided (that is, before they are stacked) have been insulated, no further insulation treatment may be required. For example, as noted above, the die as provided may have a dielectric layer formed over the integrated circuitry except over the original die pads; and, where the die is rerouted, a dielectric layer may additionally be formed over the rerouting circuitry except over the new (rerouted) interconnect pads. In such instances no additional electrical insulation may be required in the interconnect margin adjacent the pads, or between the front side of a die and the back side of a die stacked over it. And, for example, the interconnect sidewalls of the die as provided may be insulated by a conformal dielectric coating; and in such instances no additional electrical insulation may be required at the die sidewalls.

Where the interconnect sidewalls of the die as provided have not been insulated, a dielectric material may be selectively applied to the interconnect sidewalls (or at least to areas of the interconnect sidewalls that will be contacted with the electrically conductive material for the conductive traces, particularly areas that are within the trajectory defined by the respective pad position columns). In one approach, FIGS. 14A, 14B, 14C illustrate a stage in insulation of selected areas of the interconnect sidewalls by aerosol spray according to an embodiment of the invention. FIG. 14C is a partial plan view showing two pad columns in a stack of four die in an offset configuration; FIG. 14B is a partial elevational view taken toward the die sidewalls; and FIG. 14A is a partial sectional view at A-A' thru the die stack at a pad column. Each of die 13, 13', 13", 13''' in the stack has interconnect die sidewalls 136, 136', 136", 136'''. The nozzle 138 in this illustration is oriented so that the flow axis 117 of the dielectric material is directed toward the die sidewalls and, in this illustration the nozzle is moved in a work direction 149 generally parallel to the plane of the front side of the die, and generally aligned with an underlying pad column. In this example the jet apparatus is controlled so that the material flows discontinuously; that is, the material flows during intervals when the flow axis is directed at a selected target region (in this example, selected areas of the die sidewalls). As a result the regions of the surface at the respective pads are covered with discrete patches of dielectric material. At the stage illustrated, patches 142''', 142", have been completed, on targeted areas of die sidewalls 136''', 136" on die 13''', 13"; deposition of patch 142' is not yet complete, and a portion of the targeted area of die sidewall 136' has not yet been fully covered.

As may be appreciated, the nozzle may be oriented so that the flow axis is at any direction or angle within a range of directions toward the sidewalls; and the work direction need not be generally parallel to the plane of the front side of the die; and orientations and arrangements other than those shown in the illustration are contemplated.

Alternatively, the nozzle may be moved in a work direction generally over a pad column, and the flow of dielectric material may be interrupted only over pads where electrical connection is desired. Such an arrangement is shown by way of example in FIGS. 15A, 15B, 15C, illustrating a stage in insulation of selected areas of the interconnect sidewalls and of selected die pads by aerosol spray according to another embodiment of the invention. FIG. 15C is a partial plan view showing two pad columns in a stack of four die in an offset configuration; FIG. 15B is a partial elevational view taken toward the die sidewalls; and FIG. 15A is a partial sectional view at A-A' thru the die stack at a pad column. Each of die 13, 13', 13", 13'" in the stack has interconnect pads 138, 138', 138", 138'", and interconnect die sidewalls 136, 136', 136", 136'". The nozzle 130 in this illustration is oriented so that the flow axis 117 of the dielectric material is directed toward the die sidewalls and toward the die pads and, in this illustration the nozzle is moved in a work direction 159 generally parallel to the plane of the front side of the die, and generally aligned with an underlying pad column. In this example the jet apparatus is controlled so that the material flows continuously except during intervals when the flow axis is directed at a selected target region (in this example, selected die pads). As a result the regions of the surface defined by the pad columns are covered with lines of dielectric material, interrupted at die pads to be left uncovered. In the stage shown in the FIGs., the line 152 has been completed over areas of the sidewalls 136'", 136", and over the pads 138'", 138"; and a portion of the targeted area of die sidewall 136' has been partially covered. Die sidewall 136 has not yet been covered, and die pads 138' and 138 have not been covered. If, for example, die pads 138' and 138 are to be electrically connected, then as the nozzle progresses in the work direction 159 the flow of dielectric material will be interrupted so that the respective pad or pads are left substantially uncovered by dielectric material, while the remainder of the area of the sidewall 136', and the area of the sidewall 136 are covered.

FIGS. 16A, 16B, 16C illustrate an approach to insulating the interconnect die sidewalls by aerosol spray according to another embodiment of the invention. FIG. 16C is a partial plan view showing two pad columns in a stack of four die in an offset configuration; FIG. 16B is a partial elevational view taken toward the die sidewalls; and FIG. 16A is a partial sectional view at A-A' thru the die stack at a pad column. Each of die 13, 13', 13", 13'" in the stack has interconnect die sidewalls 136, 136', 136", 136'". The nozzle 138 in this illustration is oriented so that the flow axis 117 of the dielectric material is directed toward the die sidewalls and, in this illustration the nozzle 130 is moved in a work direction generally perpendicular to the plane of FIG. 16A, that is, in a direction generally parallel to an interconnect die edge. Accordingly, a line of dielectric material is deposited in a sweep along the die sidewall. As shown in the FIGs, the material flows continuously; alternatively the jet apparatus may be controlled to interrupt the flow of material so that it is deposited in patches onto selected areas of the die sidewalls located at the pad columns. In the stage shown in the FIGs., lines 162'", 162" have been completed on the die sidewall sidewalls 136'", 136"; and the die sidewall 136' has been partially covered by line 162'. Die sidewall 136 has not yet been covered. In the example shown the width of the material flow is insufficient to cover the die sidewall in a single pass in the work direction and, accordingly, the nozzle may be advanced in a direction such as is shown at 160 orthogonal to the work direction, so that successive passes of the nozzle progressively cover the surface.

Figure 17A:
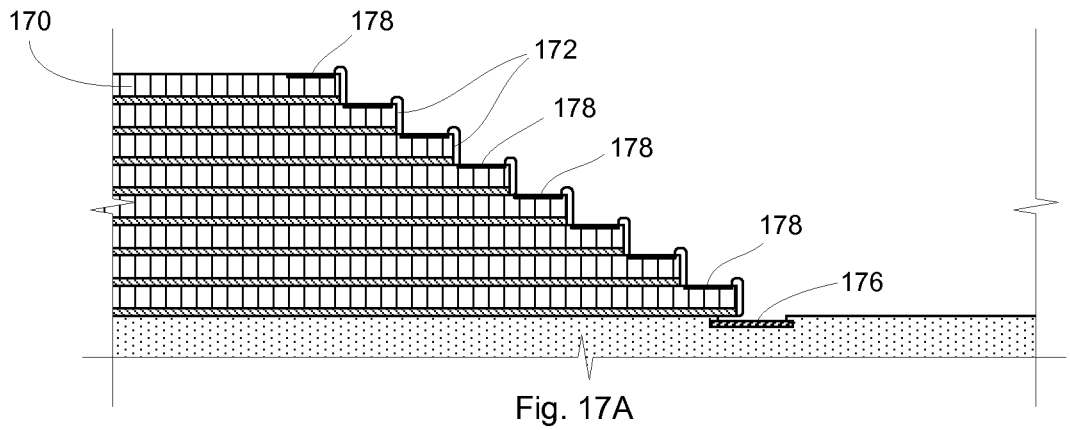
FIG. 17A is a diagrammatic sketch in a partial sectional view showing a stage in interconnecting an offset die stack according to an embodiment of the invention, following deposition of electrical insulation material onto interconnect die sidewalls.
Figure 17B:
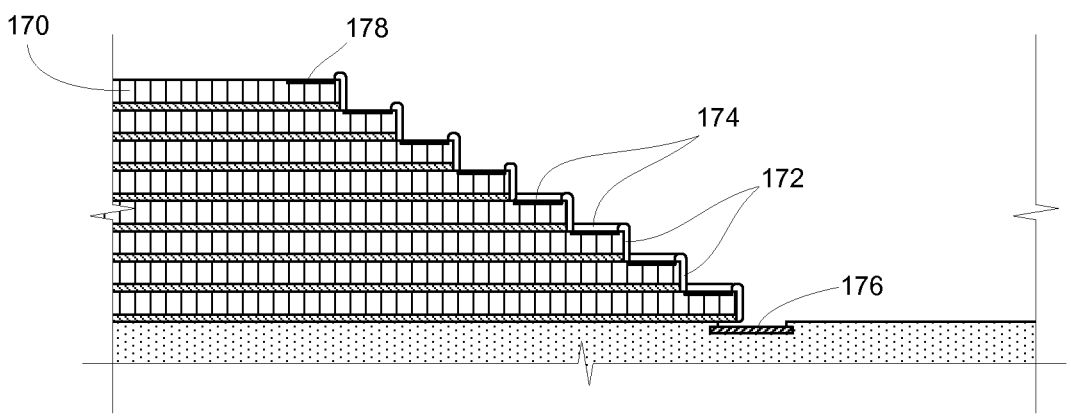
FIG. 17B is a diagrammatic sketch in a partial sectional view showing a stage in interconnecting an offset die stack as in FIG. 17A according to an embodiment of the invention, following deposition of electrical insulation material onto selected die pads.
Figure 17C:
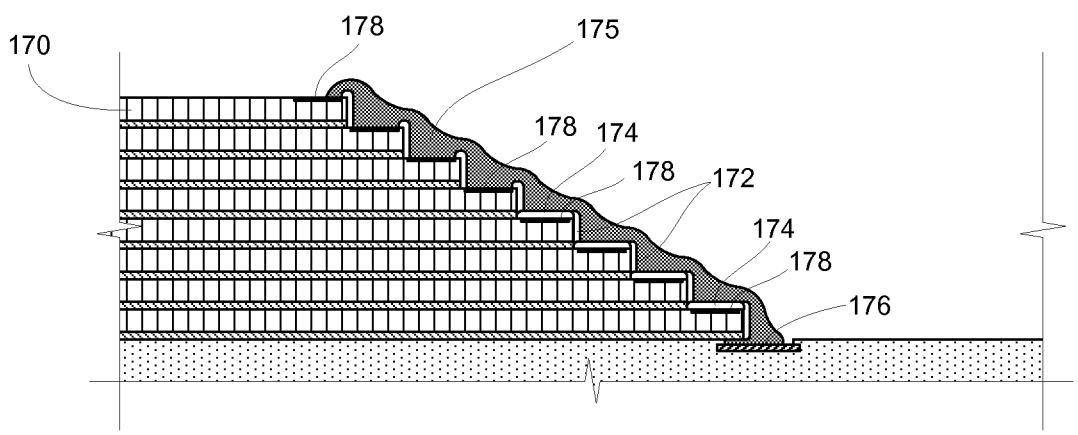
FIG. 17C is a diagrammatic sketch in a partial sectional view showing a stage in interconnecting a selectively insulated offset die stack as in FIG. 17B according to an embodiment of the invention, following deposition of electrically conductive material over a column of die pads.

In addition to insulation of interconnect sidewalls as shown for example in FIGS. 16A, 16B, 16C, selected areas of the front side of the die (such as, for example, selected die pads) may if necessary be insulated. FIGS. 17A, 17B, 17C show stages in a process in which interconnect sidewalls of an offset stack of die 170 are insulated by formation of lines or patches of dielectric material (FIG. 17A; e.g., material 172) on the die sidewalls generally as described above; and thereafter selected ones of the die pad 178 are insulated by formation of lines or patches of dielectric material (FIG. 17B; e.g., material 174), leaving certain die pads uncovered; and thereafter the uncovered pads are connected to one another and to leads 176 on the substrate by application of an electrically conductive material to form a trace 175.

As noted above with reference to FIGS. 12A-12E, any of various deposition profile shapes may be employed for depositing the insulative material. Coverage of a specified area that is larger than the deposition profile may be accomplished by moving the nozzle in a suitable work direction (as shown for example in FIGS. 13A, 13B) and, where necessary, by making multiple deposition passes (as shown for example in FIGS. 16A, 16B).

Where an area to be covered (such as a pad, for example) is suitably dimensioned and pitched, and where the material deposition profile is suitably dimensioned and shaped, it may be possible to insulate individual such areas (such as pads) by depositing a spot of insulative material without moving the nozzle. For example, the pad shape and dimensions may in some instances be about the same as the deposition profile, and the pad may be insulated by depositing a spot of material from a nozzle directed toward the pad. Where, for example the pads are rectangular as shown for example in FIG. 13C, and if the deposition profile is similarly rectangular (not shown in the FIGs.), patches of material such as the patch indicated at 134 in FIG. 13C may be formed, fully covering the pads, without moving the nozzle.

Similarly, where for example the pads are square (or roughly square rectangular), and if the deposition profile is round (for example circular or roughly circular), patches of material such as the patch indicated at 184 in FIG. 18C may be formed, fully covering the pads, without moving the nozzle.

Figure 19A:
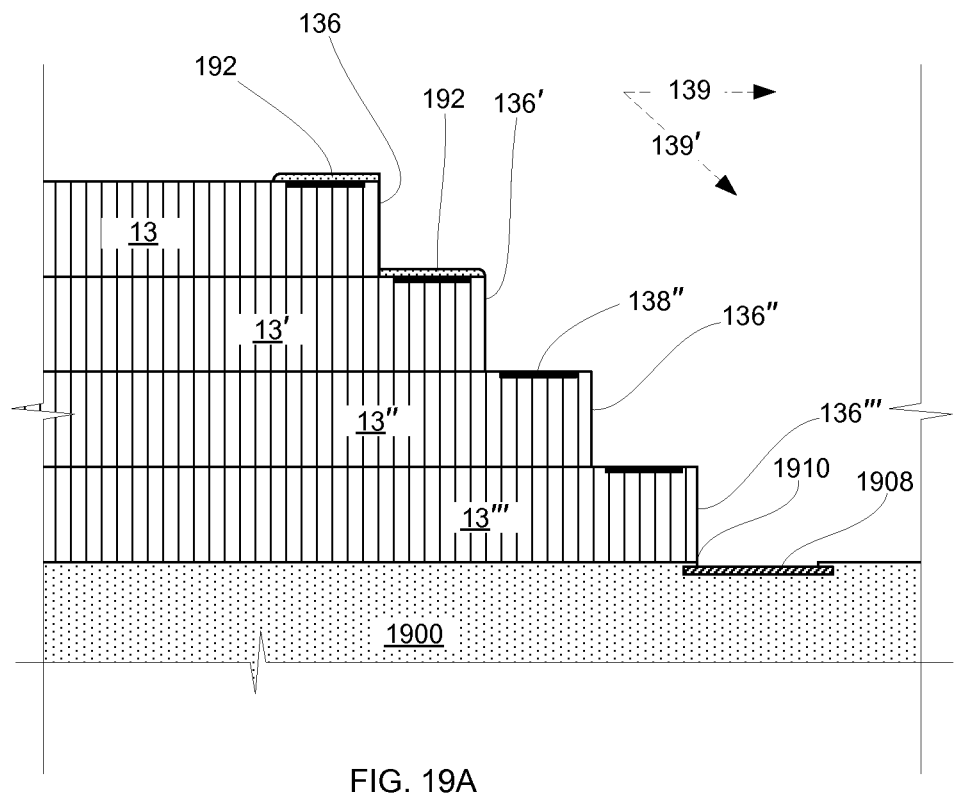
FIGS. 19A and 19B are diagrammatic sketches showing a stage in depositing electrical insulation material onto selected pads on a stack of die according to another embodiment of the invention.
Figure 19B:
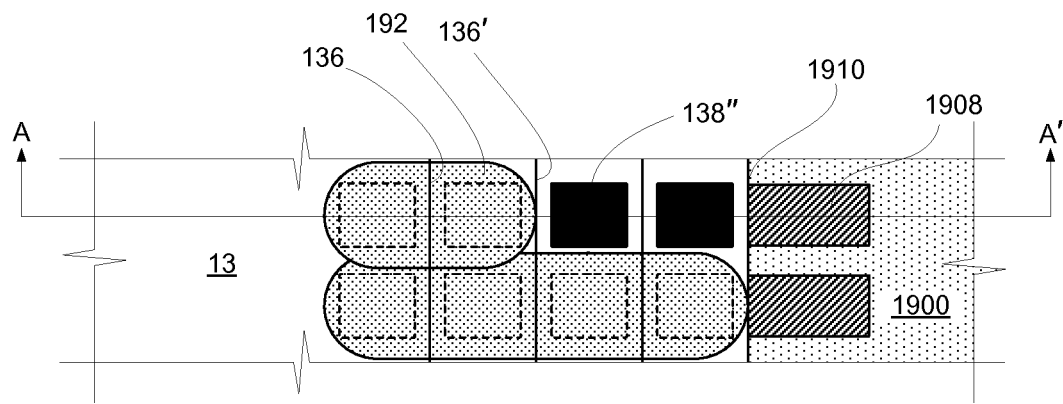

FIGS. 19A, 19B, 19C, show an embodiment in which the deposition profile is round (for example circular or roughly circular), and has a width greater than the pad width, pads in a column on adjacent die may by covered by directing the nozzle (not shown) so that the deposition angle is normal to the larger die surface, and moving the nozzle in a direction 199 or 199', for example while forming a line 192 of insulative material. The flow of material from the nozzle may in such a scheme be interrupted whenever the flow axis is directed toward a selected die that is not to be insulated.

As noted above with reference for example to FIGS. 8A, 8B, the die stack may be mounted on a support such as a substrate, and may situated on the support in various ways: in some embodiments such that the die interconnectedge of the lowermost die in the stack overlaps the leads on the substrate; or such that the lower die interconnectedge is situated at an inboard edge of the leads; or such that the lower die interconnectedge is set back (in an inboard direction) from the leads.

FIGS. 18A and 18B additionally illustrate an example in which the die stack is positioned on the substrate 1800 such that the interconnect sidewall 136'" of the lower die 13'" is set back from the leads 1808 so that the electrical interconnect material (not shown in these FIGs.) spans a strip 1810 of the substrate surface between the die sidewall and the leads.

FIGS. 19A and 19B additionally illustrate an example in which the die stack is positioned on the substrate 1900 such that the interconnect sidewall 136'" of the lower die 13'" coincides with the inboard limit of the leads 1908.

The foregoing illustrations show embodiments, for illustrative purposes, in which the die pads are shaped generally as a rectangle, having a length only slightly greater than the width. Other pad shapes are contemplated, and may in some instances be preferred. The pads may have any of a variety of shapes. Particularly, for example where the pads are arranged in a very fine pitch, it may be desirable to have the pads elongated, to ensure a sufficient area for electrical contact with the interconnect material.

Figure 20:
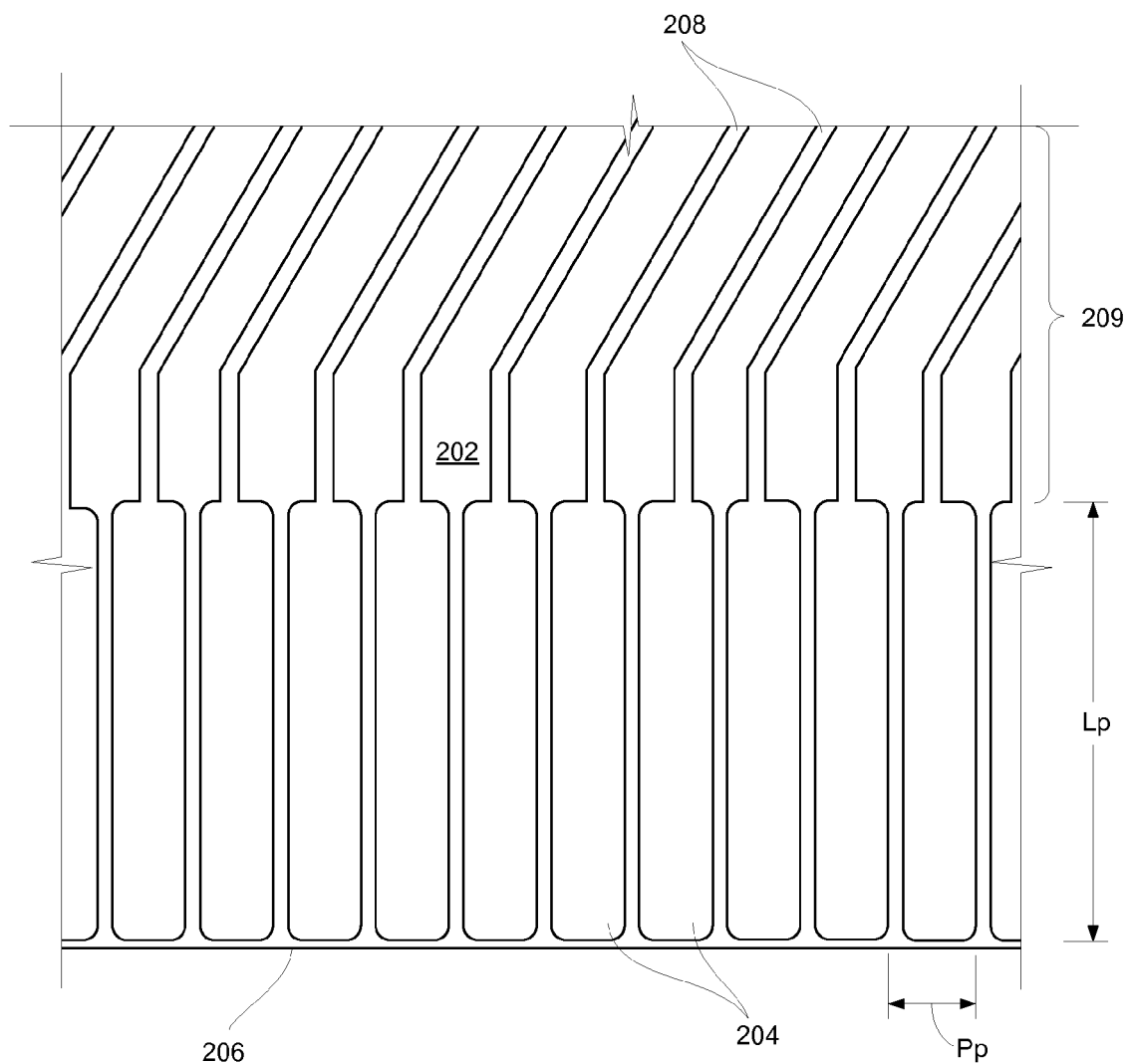
FIG. 20 is a diagrammatic sketch in a partial plan view showing a die having elongated pads in a fine pitch, and having rerouting traces exposed at the front side of the die.

FIG. 20 shows a portion of the front side 202 of a die having elongated narrow generally rectangular pads 204 arranged in a row along a interconnect die edge 206. The pad pitch is indicated at Pp, and may in practice be as fine as 60 um or less; the pad length Lp is made sufficiently great so that the contact area of the pad will be sufficient to provide an electrical connection that has a suitably low resistance and is robust. The interconnect traces (not shown in the FIGs.) will be formed lengthwise the pads. The traces may be narrower than the pad width, and may contact the pads over a length somewhat less than the pad length. Pads that are not intended to be electrically connected will be selectively coated with a dielectric material, generally as described above.

As noted above, the die are stacked in an offset configuration, so that the interconnect sidewall (and interconnectedge) of each overlying die in the stack is set back to some extent from the interconnectedge of the die beneath it, exposing for interconnection at least a portion of the die pads on the underlying die. In the embodiments illustrated above, an overlying die may be set back only enough to expose part of the pads beneath; or the overlying die may be set back enough to expose the entire pads but none of the interconnect margin inboard of the pads; or the overlying die may be set back enough to expose an area of the front side of the die inboard of the pads. In this last circumstance, where the front side of the die as provided is insulated, no further insulation of the exposed inboard area of the front side of the die is necessary.

On the other hand, the front side of the die may in some instances not be insulated, or for example the die may have exposed rerouting circuitry inboard of the pads In such circumstances a greater offset would expose an area of the rerouting circuitry inboard of the pads, and this must be insulated to prevent contact with overlying electrical interconnect traces.

The die shown in FIG. 20 is an example of a die having exposed rerouting traces 208 in an area 209 inboard of the pads 204.

Figure 21A:
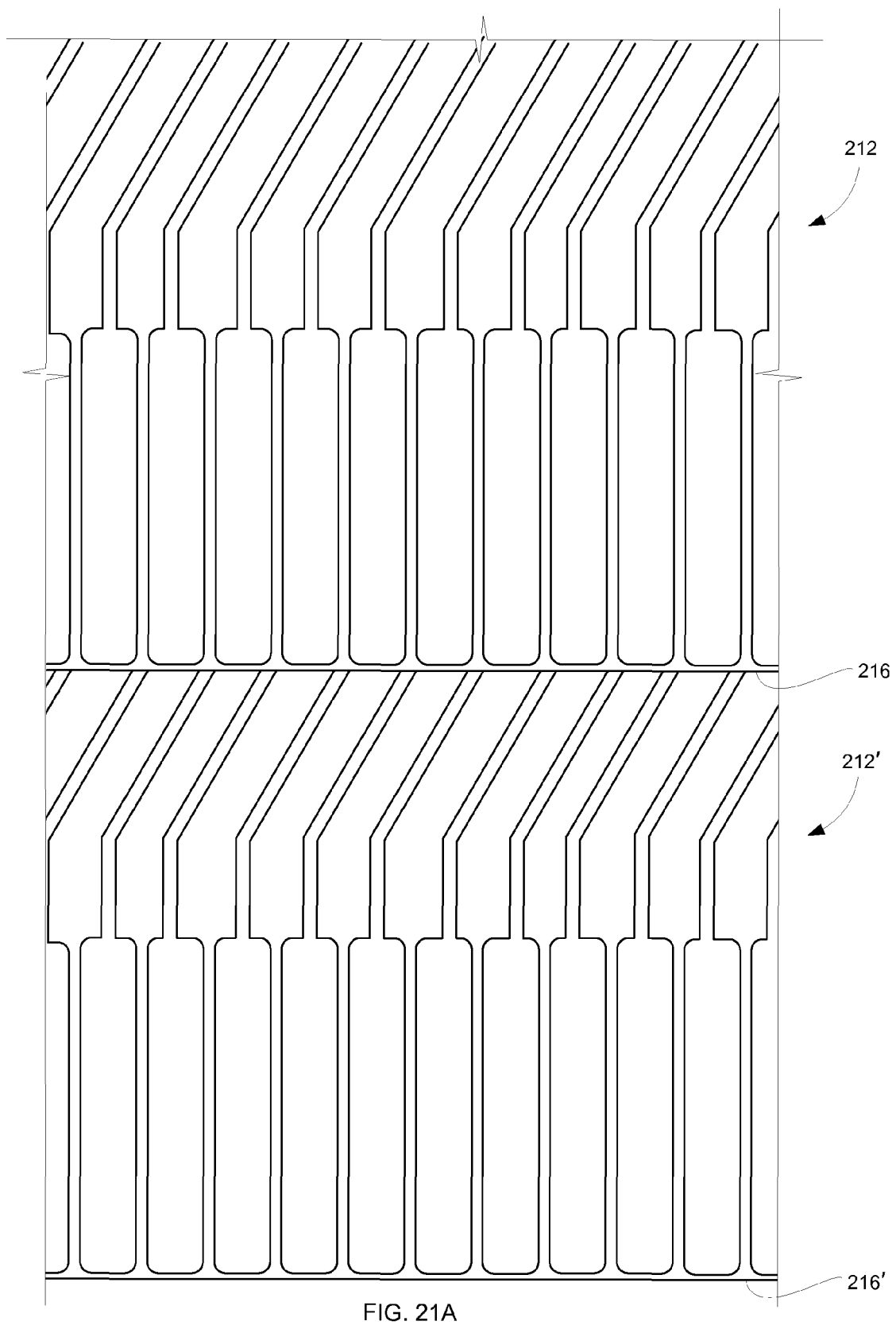
FIGS. 21A, 21B 21C and 21D are diagrammatic sketches in partial plan view showing two stacked die, in stages of an electrical insulating process according to an embodiment of the invention.

FIG. 21A shows two die, configured as in FIG. 20, stacked with a large offset. The interconnectedge 216 of the upper die 212 is set back from the interconnectedge 216' of the lower die 212', exposing not only the die pads but part of the rerouting circuitry in an area inboard of the pads on the lower die.

Figure 21B:
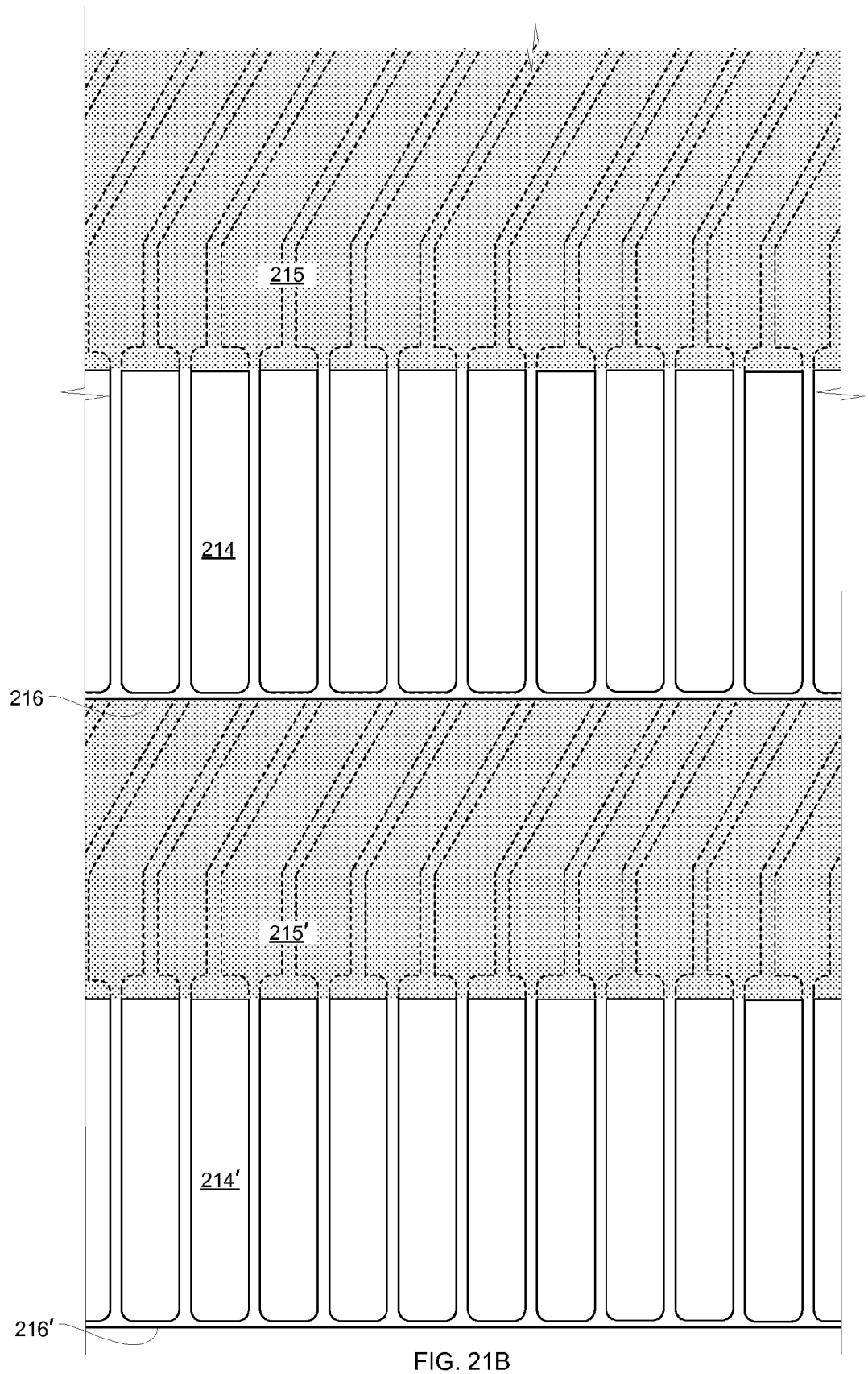

FIG. 21B shows the stacked die of FIG. 21A, following deposition of electrically insulative material in areas 215, 215' over the exposed rerouting circuitry.

Figure 21C:
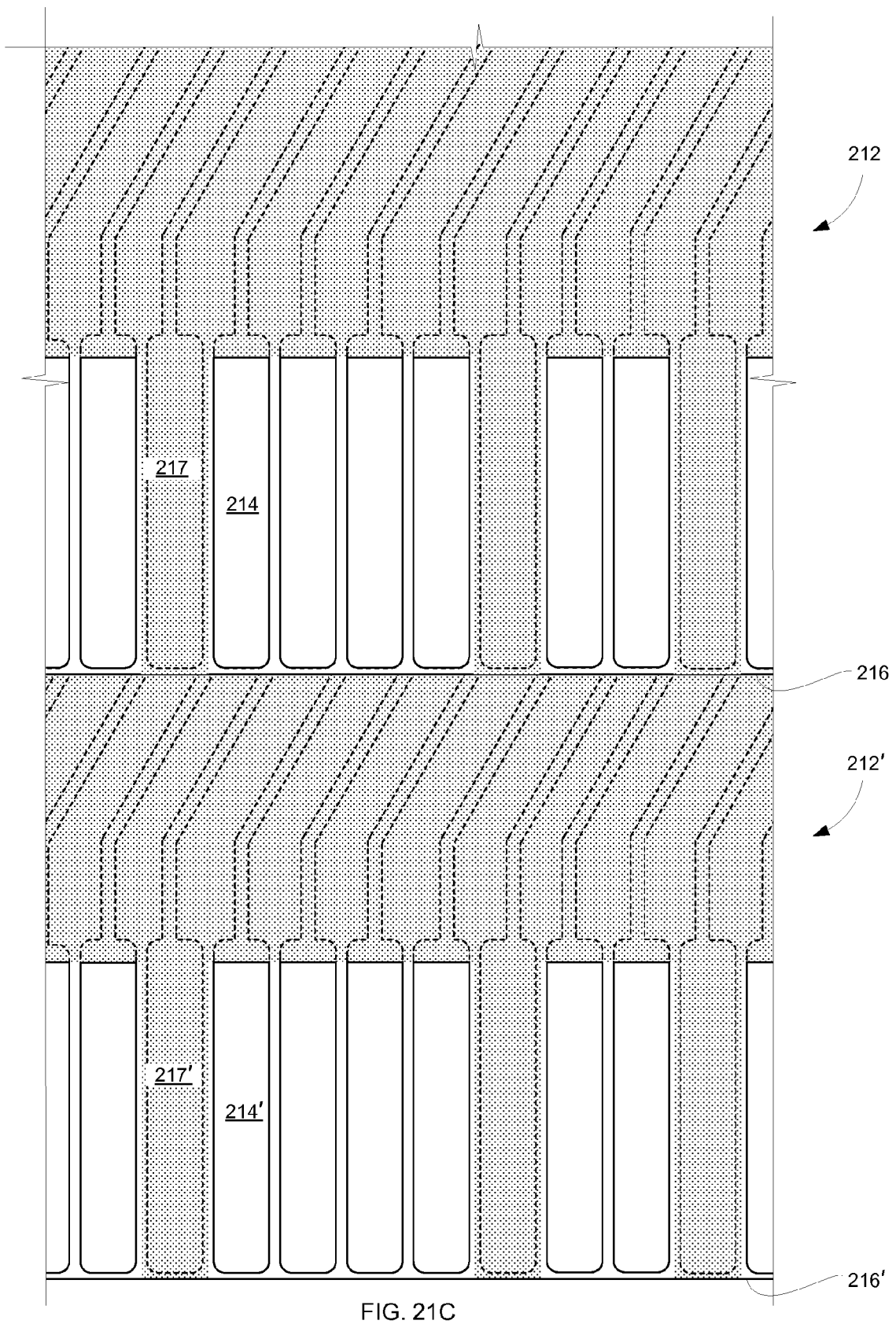

FIG. 21C shows the stack as in FIG. 21B, following deposition of electrically insulative material in areas 217, 217' over selected pads that are not to be electrically connected, leaving pads to be connected, e.g., pads 214, 214' exposed for contact with interconnect material (not shown in these FIGs.), to be subsequently deposited generally as described above.

As indicated above, electrically insulative material may additionally be selectively deposited over areas in the interconnect margin of the die; and/or electrically insulative material may additionally be selectively deposited over areas between interconnect pads, particularly adjacent pads in a row of pads, on the die.

Figure 21D:
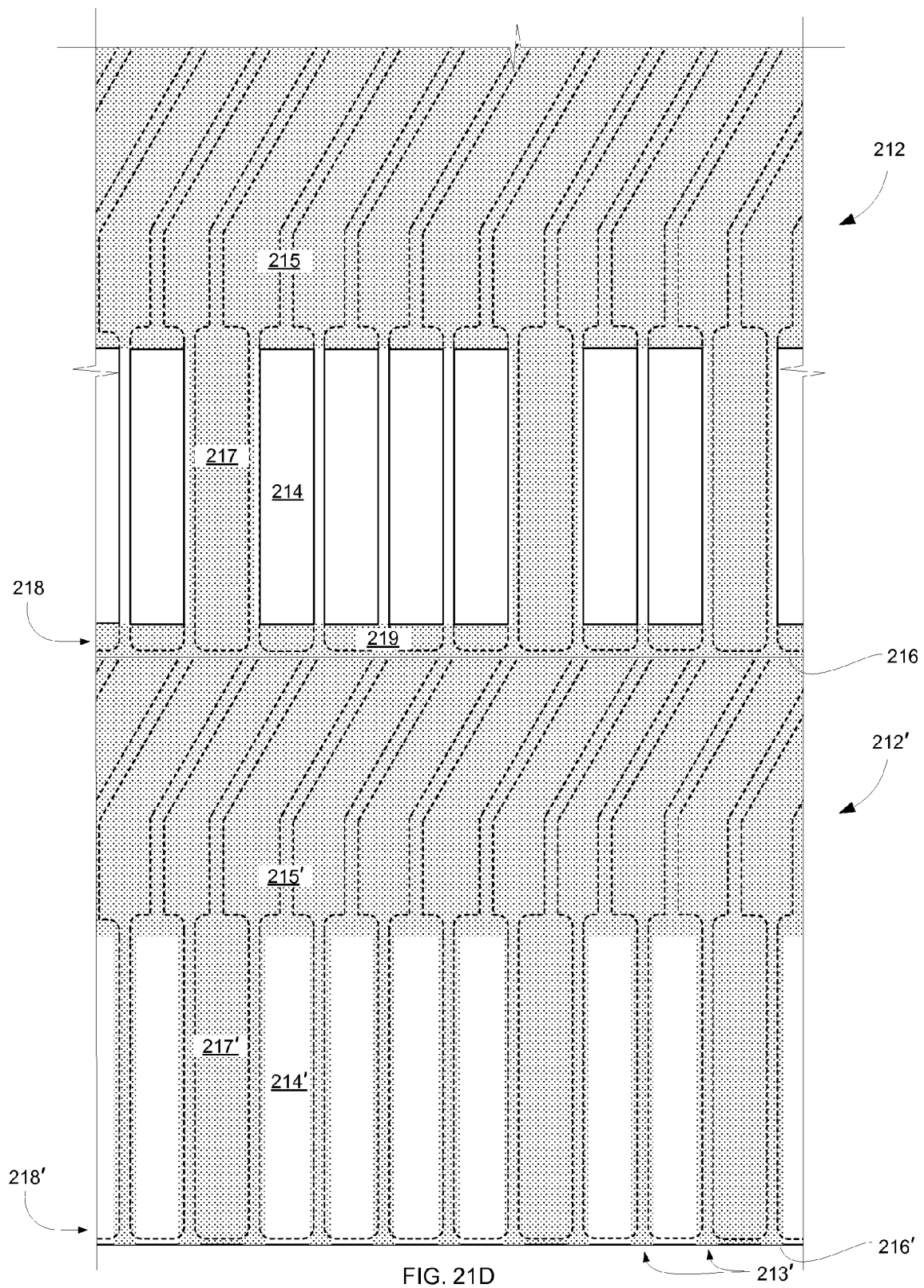

These options are illustrated in a composite manner in FIG. 21D. FIG. 21D shows the stack as in FIG. 21B, following deposition of electrically insulative material in areas 219 of the front side of die 212 adjacent an interconnectedge 216, that is, in areas of the interconnect margin 218 of die 212. (In this illustration, deposition of electrically insulative material in areas of the front side of die 212' adjacent an interconnectedge 216' has not yet been carried out.) FIG. 21D additionally shows the stack as in FIG. 21B, following deposition of electrically insulative material in areas 213' of the front side of die 212' between adjacent pads 214'. (In this illustration, deposition of electrically insulative material between pads 214 on the front side of die 212 has not yet been carried out.)

Also, as indicated above, the selectively applied insulation may optionally be chosen so that it is characterized by having a surface that is not "wettable" by the particular interconnect material that is to be applied over it; or by having a surface that is wettable, if at all, to a limited extent, so that the subsequently applied interconnect material has a reduced tendency to "run out" or to "bleed" over the surface. Given the properties of a particular chosen interconnect material, a material for the selectively applied insulation may be chosen to have the desired "non-wettable" characteristics; or the selectively applied insulation may be treated following deposition to render the surface suitably "non-wettable" to the interconnect material.

Selection of materials having these properties can aid in formation of narrower interconnects, and of interconnects having narrower pitch, without risk of electrical short between adjacent interconnect traces or between an interconnect trace and an exposed surface to which electrical connection with the trace is not desired. Particularly, for example, with reference to FIG. 21D, where the selectively applied insulation in areas 213' between pads 214' has (or is treated to have) a "non-wettable" surface, the insulation can provide a barrier between adjacent pads, resisting flow, or "bleed", or "run-out" of the subsequently applied interconnect material between adjacent interconnect traces.

Various structures other than the selectively deposited electrically insulative material as described herein, may obscure or cover various areas of the surface of the die, or of the stack of die, effectively making it unnecessary to selectively apply electrical insulation, as described herein, over those obscured or covered areas.

Figure 22:
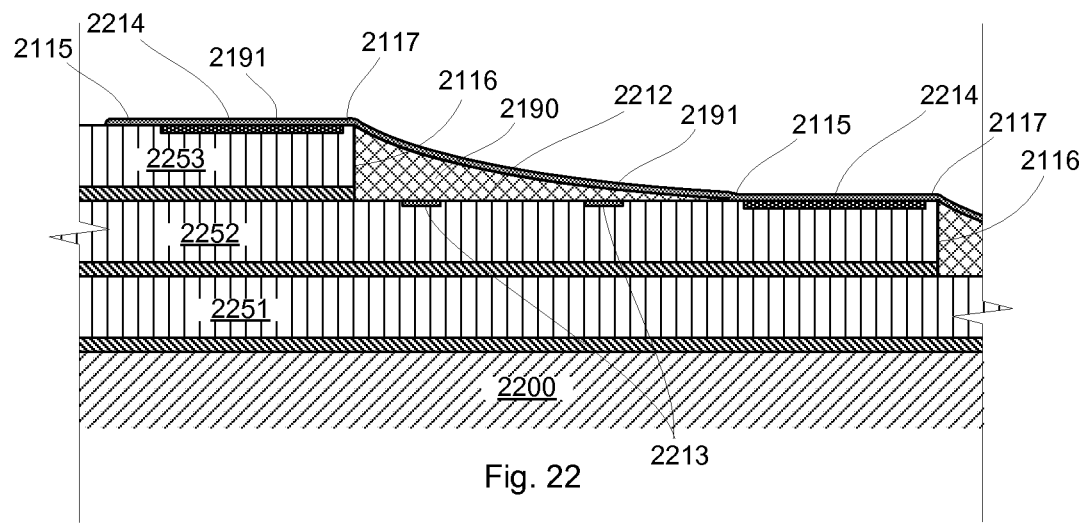
FIG. 22 is a diagrammatic sketch showing interconnected stacked die in a sectional view.

Reference is made, for example, to Jeffrey S. Leal et al. U.S. patent application Ser. No. 12/634,598, filed Dec. 9, 2009, titled "Semiconductor die interconnect formed by aerosol application of electrically conductive material", which is incorporated herein by reference. This application describes among other things electrically interconnected offset die stack assemblies, in which a dielectric material such as an underfill material is deposited at the inside angle formed by a die sidewall and an underlying surface to form a fillet; and an interconnect trace is formed passing over the surface of the fillet. FIG. 22 herein illustrates an example of such a configuration. A die 2251 is mounted on a die attach surface of a substrate 2200; a die 2252 is mounted over the die 2251; and a die 2253 is mounted over the die 2252. In this example each die is affixed to the respective underlying surfaces using an adhesive. The die are in an offset configuration, having a large die sidewall 2116 offset that exposes a large area 2212 of the underlying die inboard of the die pads 2214. Rerouting traces 2213 are situated at the exposed surface 2212, and these must be protected from contact with the die-to-die interconnect traces. In the example shown in FIG. 22, a fillet 2190 is formed at the inside angle formed by the die sidewall 2116 and the surface 2212, and the interconnect trace 2191 is formed over the fillet. In such configurations abrupt corners are avoided in the surface over which the interconnect traces are formed. Particularly, for example, the surface of the fillet (for example, fillet 2190 in FIG. 22) slopes gradually onto the surface of the underlying feature (for example, surface 2212 of underlying die 2252 in FIG. 22). And, in these examples, the fillet meets the interconnect edge at the top of the upper die sidewall (for example, sidewall 2116 of die 2253 in FIG. 22), so that the outside corner over which the interconnect trace passes at the interconnect edge of the upper die is significantly less than a right angle. Interconnect traces formed over such gradually contoured surfaces can be more robust and reliable than traces formed over abruptly angled surfaces, particularly where the traces are very thin.

As FIG. 22 shows, the interconnect trace passes over a narrow area 2117 of the front side of each die adjacent the die edge, and over an area 2115 of the front side of each die inboard of the pads 2214. Where these areas are not protected by an electrical insulation in the die as provided, and where the inboard areas 2115 are not covered by the fillet, insulation may be provided by selective deposition of electrically interconnect material as described herein.

Figure 23A:
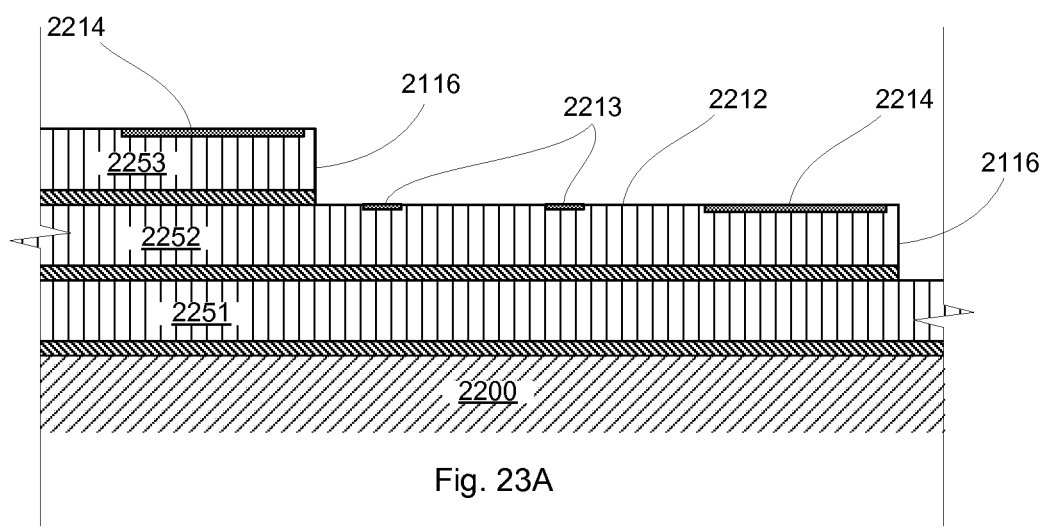
FIGS. 23A, 23B, 23C are diagrammatic sketches showing stacked die in a sectional view, in stages of an electrical insulating process according to an embodiment of the invention.
Figure 23B:
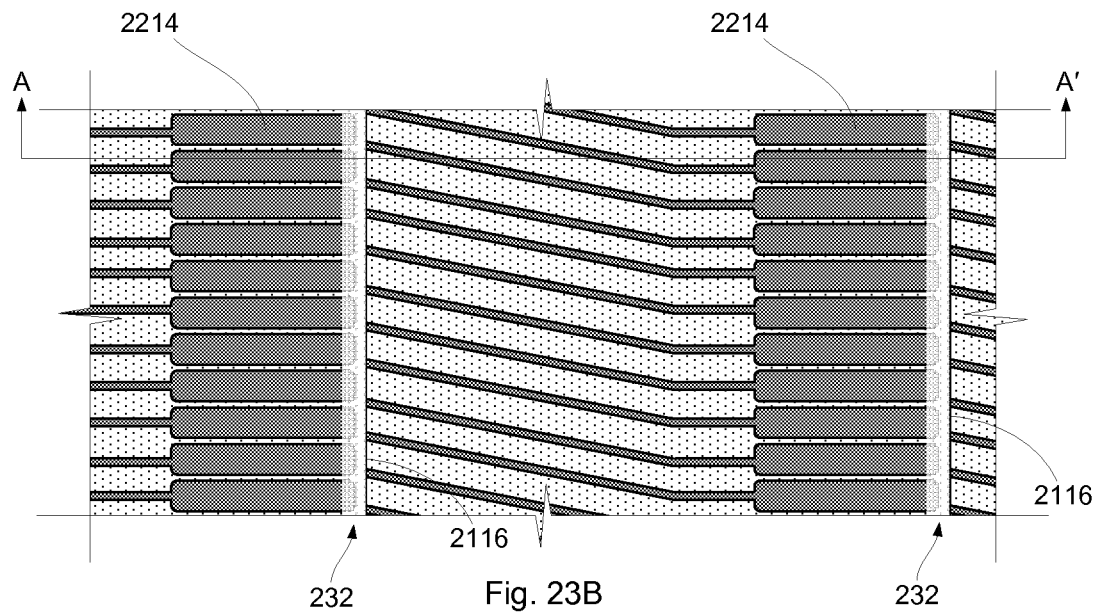
Figure 23C:
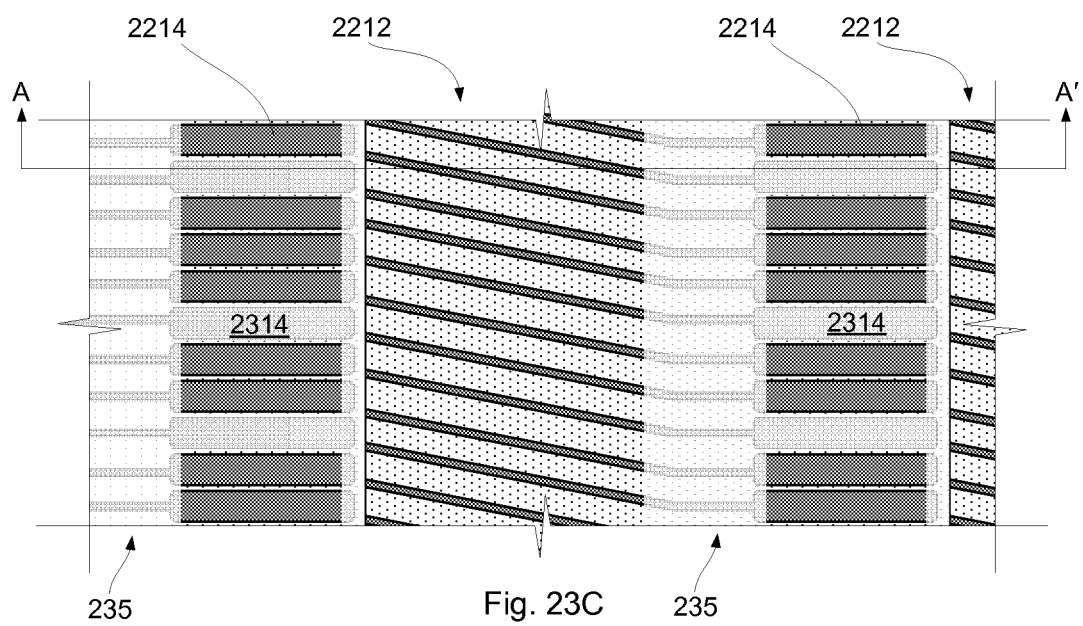

FIGS. 23A, 23B, 23C show stages in an example of a method for providing insulation to a die stack as in FIG. 22. The sectional view of FIG. 22 is taken at A-A' in FIGS. 23B, 23C.

FIG. 23A shows the die stack prior to deposition of the fillet 2190. FIG. 23B shows, in a partial plan view, the die stack following selective deposition of electrically insulative material on the narrow areas 232 in the interconnect margins adjacent the die edges 2116. FIG. 23C shows, in a partial plan view as in FIG. 23B, the die stack following selective deposition of electrically insulative material on areas 235 inboard from the die pads; and following selective deposition of electrically insulative material over selected die pads (e.g., 2314) that are not to be electrically connected. The further inboard areas 2212, across which the rerouting traces 2213 pass, need not in these configurations be covered by selectively deposited electrical insulation, inasmuch as, in these configurations, these areas will be covered by the fillet material 2190.

As noted above, electrically insulative material may additionally be deposited in narrow areas between adjacent die pads.

As will be appreciated, the dielectric material may be selectively deposited over the various areas in any sequence, and formation of the fillet may be carried out either prior to or following selective deposition of the dielectric material. Other embodiments are within the claims.

I claim:

1. A method for forming an interconnected stacked die assembly, comprising:
   providing semiconductor die having electrical interconnect pads arranged in an interconnect margin adjacent an interconnect die edge;
   stacking a plurality of said die such that a die edge at the interconnect margin of a first die is offset in relation to a die edge at the interconnect margin of a second die, and a plurality of the interconnect pads of successive die in the stack are arranged in a column;
   and then selectively depositing a dielectric material via a nozzle to provide electrical insulation on less than all of the interconnect pads in the column such that at least some of the interconnect pads in the column are free from being electrically insulated without requiring the deposited dielectric material to be removed and the at least some interconnect pads are available for electrical connection while other interconnect pads in the column are electrically insulated, the nozzle being controlled so that the dielectric material flows from the nozzle during intervals when a flow axis of the nozzle is directed at a selected interconnect pad in the column and does not flow from the nozzle during intervals when the flow axis is directed at an unselected interconnect pad in the column.

2. The method of claim 1 wherein the selectively depositing the dielectric material also includes depositing the dielectric material onto a selected region of a sidewall surface of at least one die in the stack.

3. The method of claim 1 wherein the selectively depositing the dielectric material also includes depositing the dielectric material onto a selected area of a front side of at least one die in the stack.

4. The method of claim 1 wherein the selectively depositing the dielectric material also includes depositing the dielectric material onto a selected area inboard of at least one of the other interconnect pads.

5. The method of claim 1 wherein the selectively depositing the dielectric material also includes depositing the dielectric material onto a selected area of the interconnect margin of at least one die in the stack.

6. The method of claim 1 wherein the selectively depositing the dielectric material also includes depositing the dielectric material onto a selected area adjacent the interconnect die edge of at least one die in the stack.

7. The method of claim 1 wherein the selectively depositing the dielectric material also includes depositing the dielectric material onto a selected area between interconnect pads.

8. The method of claim 1, further comprising forming a conformal electrically conductive trace contacting an interconnect pad and passing over an insulating region resulting from selectively depositing the dielectric material.

9. The method of claim 8 wherein the dielectric material is characterized by having a surface at least partly nonwettable by the electrically conductive material.

10. The method of claim 8, further comprising treating the deposited dielectric material so that a surface thereof is at least partly nonwettable by the electrically conductive material.

11. A method for forming a stacked die assembly, comprising:
    providing semiconductor die having electrical interconnect pads arranged in an interconnect margin adjacent an interconnect die edge;
    stacking a plurality of said die such that the pads in successive die in the stack are arranged in a column;
    and then selectively depositing electrical insulation via a nozzle on less than all of the interconnect pads in the column such that at least some of the interconnect pads in the column are free from being electrically insulated without requiring the deposited electrical insulation to be removed and the at least some interconnect pads are available for electrical connection while other interconnect pads in the column are electrically insulated, the nozzle being controlled so that the dielectric material flows from the nozzle during intervals when a flow axis of the nozzle is directed at a selected interconnect pad in the column and does not flow from the nozzle during intervals when the flow axis is directed at an unselected interconnect pad in the column; and
    forming electrically conductive traces over the columns.

12. The method of claim 11, wherein the plurality of said die are in an offset configuration in which successive die in the stack are offset at the interconnect die edge.

13. The method of claim 8, wherein when forming the conformal electrically conductive trace, at least a portion of a front or rear side of a die disposed at a top of the stack is substantially free from dielectric material such that semiconductor material of the die is exposed while a sidewall thereof includes the dielectric material.

14. The method of claim 1, wherein the selectively depositing the dielectric material also includes depositing the dielectric material onto a selected region of a sidewall surface of a top die disposed at the top of the stack such that at least a portion of a front surface of the top die remains substantially free from being deposited with the dielectric material and a semiconductor material comprising the die is substantially exposed at the front surface; and further comprising forming an electrically conductive trace over the dielectric material over the selected region while the dielectric material is disposed thereon and while the at least a portion of the front surface of the top die remains substantially free from the dielectric material.

15. The method of claim 11, wherein the selectively depositing the dielectric material also includes depositing the dielectric material onto a selected region of a sidewall surface of a top die disposed at the top of the stack such that at least a portion of a front surface of the top die remains substantially free from being deposited with the dielectric material and a semiconductor material comprising the die is exposed at the front surface; and forming the electrically conductive traces includes forming an electrically conductive trace over the selected region while the dielectric material is disposed thereon and while the at least a portion of the front surface of the top die remains substantially free from the dielectric material.

16. The method of claim 2, wherein the selected region of the sidewall surface is within a trajectory defined by positions of the interconnect pads in the column, and selectively depositing the dielectric material onto the selected region covers the selected region with a discrete patch of the dielectric material.

17. The method of claim 1, further comprising:
selectively depositing the dielectric material via the nozzle onto an interconnect sidewall of at least one die in the stack during intervals when the flow axis is directed at a selected area of the interconnect sidewall.

18. The method of claim 11, further comprising:
selectively depositing the electrical insulation via the nozzle onto an interconnect sidewall of at least one die in the stack during intervals when the flow axis is directed at a selected area of the interconnect sidewall.

19. The method of claim 18, further comprising:
positioning the flow axis in a first angular relationship with respect to a front surface of the at least one die for selectively depositing the electrical insulation on less than all of the interconnect pads in the column, and
positioning the flow axis in a second angular relationship with respect to the front surface of the at least one die for selectively depositing the electrical insulation on the interconnect sidewall of the at least one die.

20. The method of claim 19, wherein in the first angular orientation, the flow axis is perpendicular to the front surface of the at least one die, and in the second angular orientation, the flow axis is parallel to the front surface of the at least one die.

* * * * *